(12) United States Patent
Chen et al.

(10) Patent No.: US 10,510,734 B2
(45) Date of Patent: Dec. 17, 2019

(54) SEMICONDUCTOR PACKAGES HAVING DUMMY CONNECTORS AND METHODS OF FORMING SAME

(71) Applicant: Taiwan Semiconductor Manufacturing Company, Ltd., Hsinchu (TW)

(72) Inventors: Chen-Shien Chen, Zhubei (TW); Hsiu-Jen Lin, Zhubei (TW); Ming-Chih Yew, Hsinchu (TW); Ming-Da Cheng, Jhubei (TW); Yi-Jen Lai, Hsinchu (TW); Yu-Tse Su, Chiayi (TW); Sey-Ping Sun, Hsinchu (TW); Yang-Che Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/206,868

(22) Filed: Nov. 30, 2018

(65) Prior Publication Data

US 2019/0115326 A1 Apr. 18, 2019

Related U.S. Application Data

(62) Division of application No. 15/669,563, filed on Aug. 4, 2017, now Pat. No. 10,276,548.

(Continued)

(51) Int. Cl.
*H01L 21/768* (2006.01)
*H01L 25/10* (2006.01)
(Continued)

(52) U.S. Cl.
CPC ...... *H01L 25/105* (2013.01); *H01L 23/49816* (2013.01); *H01L 24/19* (2013.01);
(Continued)

(58) Field of Classification Search
CPC ..... H01L 21/50; H01L 21/56; H01L 221/768; H01L 21/76877; H01L 21/66;
(Continued)

(56) References Cited

U.S. PATENT DOCUMENTS 7,855,443 B2 12/2010 Tsai et al.
8,975,726 B2 3/2015 Chen et al.
(Continued)

FOREIGN PATENT DOCUMENTS

CN 103579159 A 2/2014
CN 104900598 A 9/2015
(Continued)

*Primary Examiner* — Chuong A Luu
(74) *Attorney, Agent, or Firm* — Slater Matsil, LLP

(57) ABSTRACT

An embodiment package includes a first package. The first package includes a first integrated circuit die, an encapsulant around the first integrated circuit die, and redistribution layers over the encapsulant and the first integrated circuit die. The package also includes a second package bonded to the first package by a plurality of functional connectors. The functional connectors and the redistribution layers electrically connect a second integrated circuit die of the second package to the first integrated circuit die. The package also includes a plurality of dummy connectors disposed between the first package and the second package. One end of each of the plurality of dummy connectors facing the first package is physically separated from the first package.

20 Claims, 43 Drawing Sheets

Related U.S. Application Data

(60) Provisional application No. 62/394,545, filed on Sep. 14, 2016.

(51) Int. Cl.
  *H01L 23/498* (2006.01)
  *H01L 23/00* (2006.01)
  *H01L 25/00* (2006.01)
  *H01L 23/31* (2006.01)

(52) U.S. Cl.
  CPC .............. *H01L 24/20* (2013.01); *H01L 25/50* (2013.01); *H01L 23/00* (2013.01); *H01L 23/31* (2013.01); *H01L 2225/1058* (2013.01)

(58) Field of Classification Search
  CPC ............. H01L 21/565; H01L 21/67126; H01L 21/67121; H01L 21/6715; H01L 21/76802; H01L 25/00; H01L 25/50; H01L 25/10; H01L 25/105; H01L 25/065; H01L 25/0657; H01L 24/19; H01L 24/20
  USPC .................................. 257/737; 438/106, 112
  See application file for complete search history.

(56) References Cited

U.S. PATENT DOCUMENTS

| | | | |
|---|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 9,793,246 B1 | 10/2017 | Tseng et al. |
| 2007/0246811 A1 | 10/2007 | Tsai et al. |
| 2008/0142944 A1 | 6/2008 | Oi et al. |
| 2014/0045379 A1 | 2/2014 | Chen |
| 2015/0255432 A1 | 9/2015 | Lin et al. |
| 2015/0270247 A1* | 9/2015 | Chen ....................... H01L 24/19 257/738 |
| 2015/0380328 A1 | 12/2015 | Wang et al. |
| 2016/0064367 A1 | 3/2016 | Hwang et al. |
| 2016/0093572 A1 | 3/2016 | Chen |

FOREIGN PATENT DOCUMENTS

| | | |
|---|---|---|
| KR | 20080055642 A | 6/2008 |
| KR | 20160037805 A | 4/2016 |
| KR | 20160063240 A | 6/2016 |
| TW | 200741901 A | 11/2007 |
| TW | 200828565 A | 7/2008 |
| TW | 201410089 A | 3/2014 |
| TW | 201415586 A | 4/2014 |

* cited by examiner

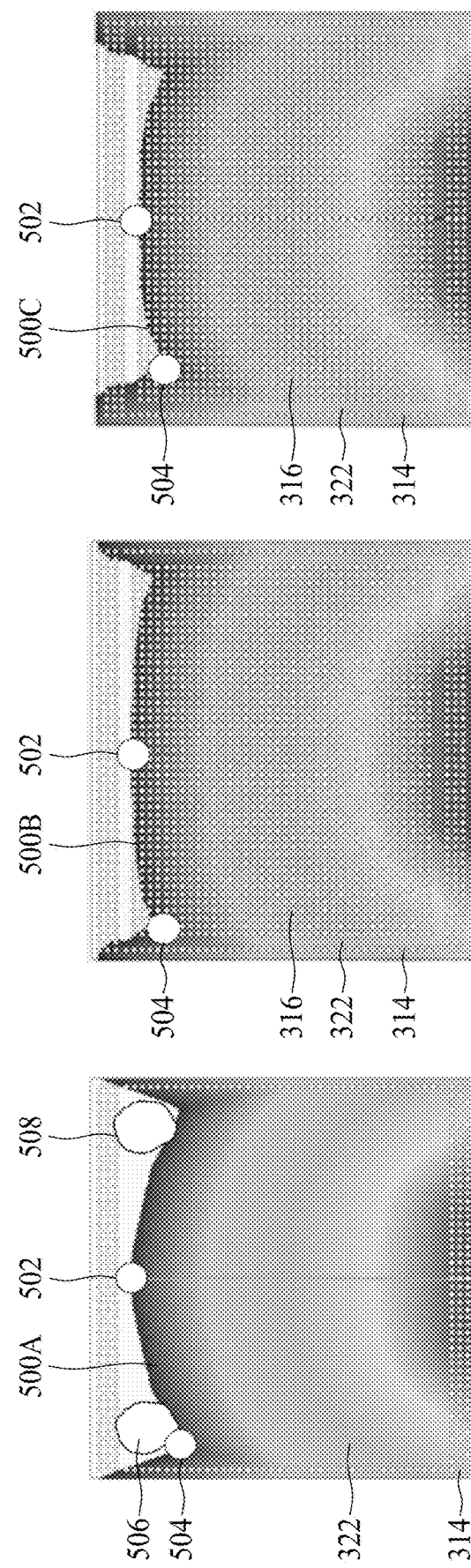

SEMICONDUCTOR PACKAGES HAVING DUMMY CONNECTORS AND METHODS OF FORMING SAME

PRIORITY

This application is a divisional of U.S. application Ser. No. 15/669,563, filed on Aug. 4, 2017, claims the benefit of U.S. Provisional Application No. 62/394,545, filed on Sep. 14, 2016, which applications are hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 27A, 27B, 27C, 28A, 28B, and 28C illustrate top down views of underfill wave fronts during simulation tests in accordance with some embodiments.

DETAILED DESCRIPTION

Figure 1:
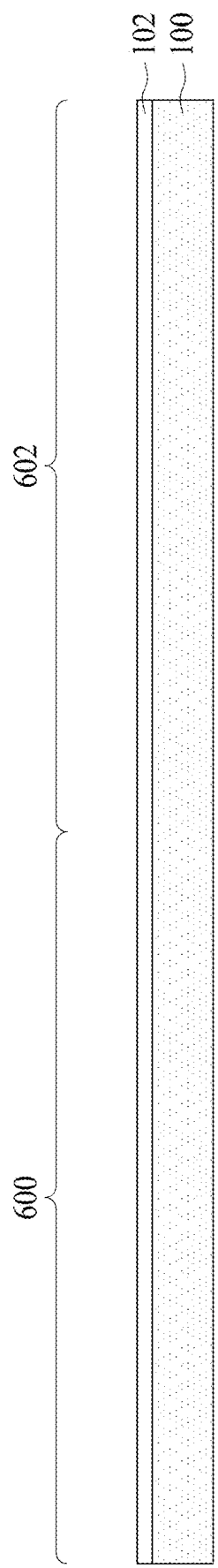
FIGS. 1, 2, 3, 4, 5, 6, 7, 8, 9, 10, 11, 12, 13, 14, 15, 16, 17, 18, 19, 20, 21A, and 21B illustrate cross-sectional views of intermediate steps during a process for forming a first package structure and for attaching other package structures to the first package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely a package structure (e.g., a package on package (PoP) structure) having dummy connectors disposed between a first package component and a second package component. In some embodiment, the second package component is a memory package (e.g., having one or more dynamic random access memory (DRAM) dies), which is physically and electrically coupled to the first package component (e.g., an integrated fan-out (InFO) package having a logic die and redistribution structures) using functional connectors. The dummy connectors may be physically and/or electrically disconnected from functional circuits of the first package component (e.g., the logic die and the redistribution structures). In some embodiments, the dummy connectors may also be electrically disconnected from functional circuits of the second package component.

The functional connectors may be disposed at a periphery of the first and second package components in a top down view. The dummy connectors may be disposed at a central region of the first and second package components in the top down view. In some embodiments, the functional connectors may encircle the dummy connectors in the top down view. After the first and second package components are bonded together, an underfill may be dispensed between the first and second package components and around the functional connectors and the dummy connectors. It has been observed by including dummy connectors in various embodiment packages, a wave front of the underfill may be flattened during dispensation. A flattened wave front can reduce defects (e.g., the presence and/or size of voids) in the underfill between the first and second package components. Compared to embodiments without dummy connectors, underfill defects (e.g., voids) may be reduced, which may lead to higher yield and fewer manufacturing defects both before and after reliability testing. For example, larger voids or a greater quantity of voids may result in a pop-corning effect after reliability tests, which may cause package failure. By including dummy connectors, such voids can be reduced in both quantity and size.

Further, the teachings of this disclosure are applicable to any package structure including functional connectors bonding two package components. Other embodiments contemplate other applications, such as different package types or different configurations that would be readily apparent to a person of ordinary skill in the art upon reading this disclosure. It should be noted that embodiments discussed herein may not necessarily illustrate every component or feature that may be present in a structure. For example, multiples of a component may be omitted from a figure, such as when discussion of one of the component may be sufficient to convey aspects of the embodiment. Further, method embodiments discussed herein may be discussed as being performed in a particular order; however, other method embodiments may be performed in any logical order.

FIGS. 1 through 20 illustrate cross-sectional views of intermediate steps during a process for forming a first package component in accordance with some embodiments. FIG. 1 illustrates a carrier substrate 100 and a release layer 102 formed on the carrier substrate 100. A first package region 600 and a second package region 602 for the formation of a first package and a second package, respectively, are illustrated.

The carrier substrate 100 may be a glass carrier substrate, a ceramic carrier substrate, or the like. The carrier substrate 100 may be a wafer, such that multiple packages can be formed on the carrier substrate 100 simultaneously. The release layer 102 may be formed of a polymer-based material, which may be removed along with the carrier substrate 100 from the overlying structures that will be formed in subsequent steps. In some embodiments, the release layer 102 is an epoxy-based thermal-release material, which loses its adhesive property when heated, such as a light-to-heat-conversion (LTHC) release coating. In other embodiments, the release layer 102 may be an ultra-violet (UV) glue, which loses its adhesive property when exposed to UV lights. The release layer 102 may be dispensed as a liquid and cured, may be a laminate film laminated onto the carrier substrate 100, or may be the like. The top surface of the release layer 102 may be leveled and may have a high degree of coplanarity.

Figure 2:
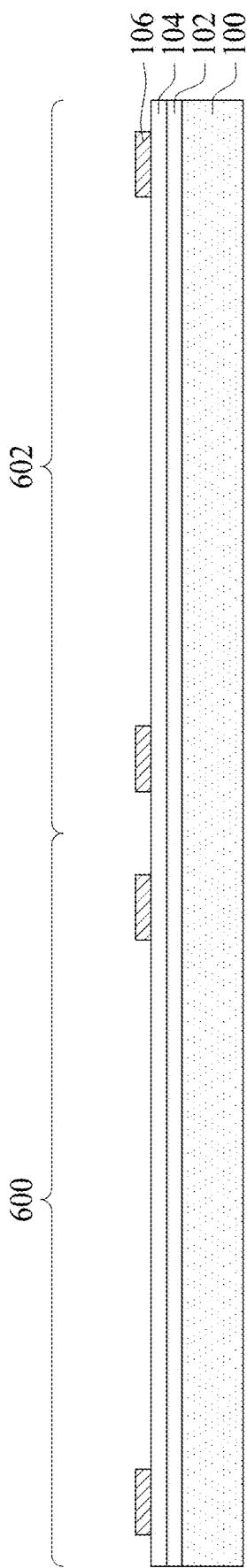

In FIG. 2, a dielectric layer 104 and a metallization pattern 106 (sometimes referred to as a redistribution layer 106 or redistribution line 106) are formed. As illustrated in FIG. 2, a dielectric layer 104 is formed on the release layer 102. The bottom surface of the dielectric layer 104 may be in contact with the top surface of the release layer 102. In some embodiments, the dielectric layer 104 is formed of a polymer, such as polybenzoxazole (PBO), polyimide, benzocyclobutene (BCB), or the like. In other embodiments, the dielectric layer 104 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 104 may be formed by any acceptable deposition process, such as spin coating, chemical vapor deposition (CVD), laminating, the like, or a combination thereof.

The metallization pattern 106 is formed on the dielectric layer 104. As an example to form metallization pattern 106, a seed layer (not shown) is formed over the dielectric layer 104. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 106. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 106.

Figure 3:
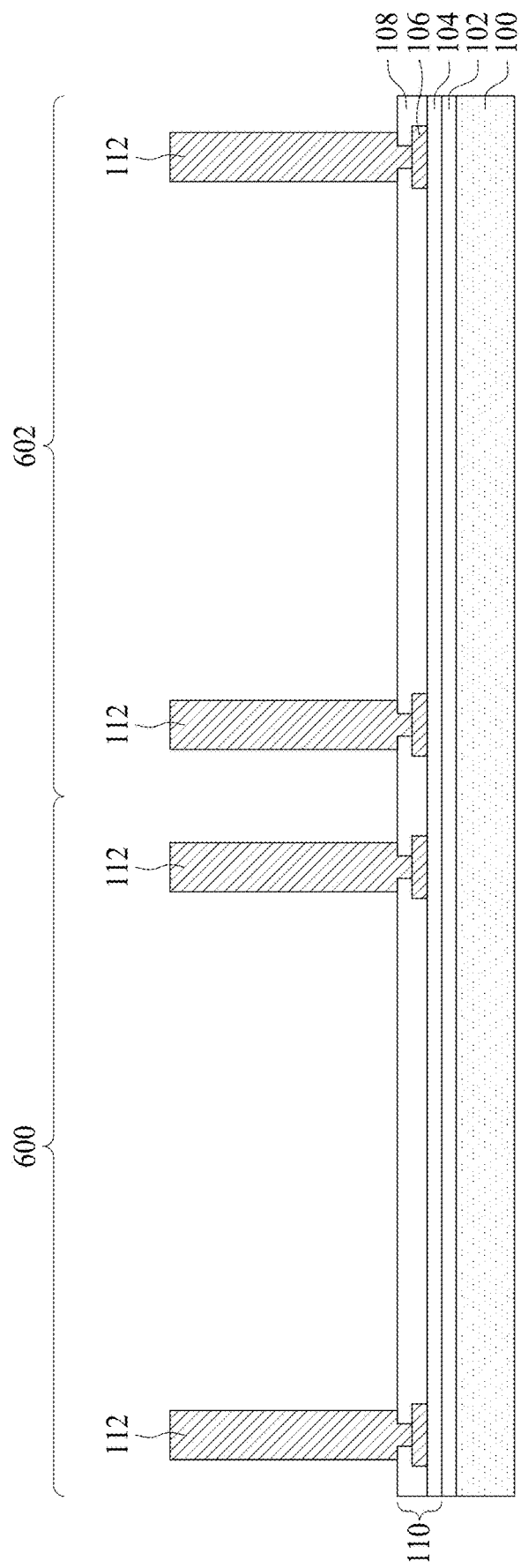

In FIG. 3, a dielectric layer 108 is formed on the metallization pattern 106 and the dielectric layer 104. In some embodiments, the dielectric layer 108 is formed of a polymer, which may be a photo-sensitive material such as PBO, polyimide, BCB, or the like, that may be patterned using a lithography mask. In other embodiments, the dielectric layer 108 is formed of a nitride such as silicon nitride; an oxide such as silicon oxide, PSG, BSG, BPSG; or the like. The dielectric layer 108 may be formed by spin coating, lamination, CVD, the like, or a combination thereof. The dielectric layer 108 is then patterned to form openings to expose portions of the metallization pattern 106. The patterning may be by an acceptable process, such as by exposing the dielectric layer 108 to light when the dielectric layer is a photo-sensitive material or by etching using, for example, an anisotropic etch.

The dielectric layers 104 and 108 and the metallization patterns 106 may be referred to as a back-side redistribution structure 110. As illustrated, the back-side redistribution structure 110 includes the two dielectric layers 104 and 108 and one metallization pattern 106. In other embodiments, the back-side redistribution structure 110 can include any number of dielectric layers, metallization patterns, and vias. One or more additional metallization pattern and dielectric layer may be formed in the back-side redistribution structure 110 by repeating the processes for forming a metallization patterns 106 and dielectric layer 108. Vias may be formed during the formation of a metallization pattern by forming the seed layer and conductive material of the metallization pattern in the opening of the underlying dielectric layer. The vias may therefore interconnect and electrically couple the various metallization patterns.

Further in FIG. 3, through vias 112 are formed. As an example to form the through vias 112, a seed layer is formed over the back-side redistribution structure 110, e.g., the dielectric layer 108 and the exposed portions of the metallization pattern 106 as illustrated. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is formed and patterned on the seed layer. The photo resist may be formed by spin coating or the like and may be exposed to light for patterning. The pattern of the photo resist corresponds to through vias. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. The photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form through vias 112.

Figure 4:
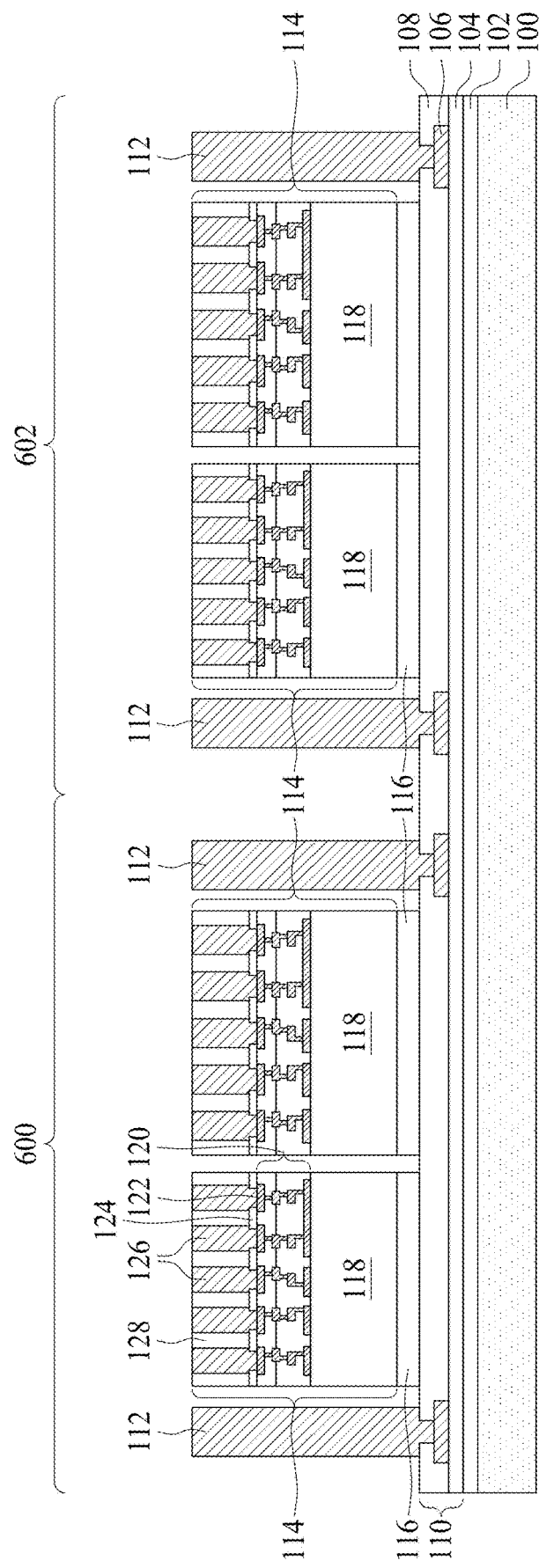

In FIG. 4, integrated circuit dies 114 are adhered to the dielectric layer 108 by an adhesive 116. As illustrated in FIG. 4, two integrated circuit dies 114 are adhered in each of the first package region 600 and the second package region 602, and in other embodiments, more or less integrated circuit dies 114 may be adhered in each region. For example, in an embodiment, only one integrated circuit die 114 may be adhered in each region. The integrated circuit dies 114 may be logic dies (e.g., central processing unit, microcontroller, etc.), memory dies (e.g., dynamic random access memory (DRAM) die, static random access memory (SRAM) die, etc.), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. Also, in some embodiments, the integrated circuit dies 114 may be different sizes (e.g., different heights and/or surface areas), and in other embodiments, the integrated circuit dies 114 may be the same size (e.g., same heights and/or surface areas).

Before being adhered to the dielectric layer 108, the integrated circuit dies 114 may be processed according to applicable manufacturing processes to form integrated circuits in the integrated circuit dies 114. For example, the integrated circuit dies 114 each include a semiconductor substrate 118, such as silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate 118 and may be interconnected by interconnect structures 120 formed by, for example, metallization patterns in one or more dielectric layers on the semiconductor substrate 118 to form an integrated circuit.

The integrated circuit dies 114 further comprise pads 122, such as aluminum pads, to which external connections are made. The pads 122 are on what may be referred to as respective active sides of the integrated circuit dies 114. Passivation films 124 are on the integrated circuit dies 114 and on portions of the pads 122. Openings are through the passivation films 124 to the pads 122. Die connectors 126, such as conductive pillars (for example, comprising a metal such as copper), are in the openings through the passivation films 124 and are mechanically and electrically coupled to the respective pads 122. The die connectors 126 may be formed by, for example, plating, or the like. The die connectors 126 electrically couple the respective integrated circuits of the integrate circuit dies 114.

A dielectric material 128 is on the active sides of the integrated circuit dies 114, such as on the passivation films 124 and the die connectors 126. The dielectric material 128 laterally encapsulates the die connectors 126, and the dielectric material 128 is laterally coterminous with the respective integrated circuit dies 114. The dielectric material 128 may be a polymer such as PBO, polyimide, BCB, or the like; a nitride such as silicon nitride or the like; an oxide such as silicon oxide, PSG, BSG, BPSG, or the like; the like, or a combination thereof, and may be formed, for example, by spin coating, lamination, CVD, or the like.

Adhesive 116 is on back-sides of the integrated circuit dies 114 and adheres the integrated circuit dies 114 to the back-side redistribution structure 110, such as the dielectric layer 108 in the illustration. The adhesive 116 may be any suitable adhesive, epoxy, die attach film (DAF), or the like. The adhesive 116 may be applied to a back-side of the integrated circuit dies 114, such as to a back-side of the respective semiconductor wafer or may be applied over the surface of the carrier substrate 100. The integrated circuit dies 114 may be singulated, such as by sawing or dicing, and adhered to the dielectric layer 108 by the adhesive 116 using, for example, a pick-and-place tool.

Figure 5:
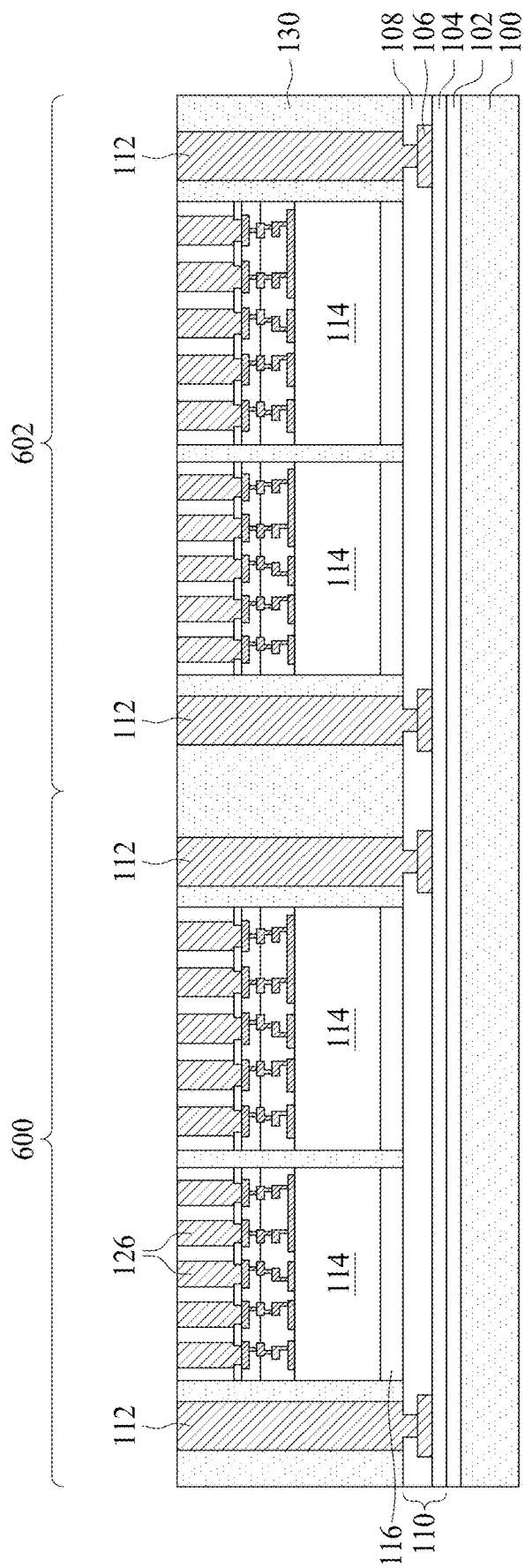

In FIG. 5, an encapsulant 130 is formed on the various components. The encapsulant 130 may be a molding compound, epoxy, or the like, and may be applied by compression molding, transfer molding, or the like. After curing, the encapsulant 130 can undergo a grinding process to expose the through vias 112 and die connectors 126. Top surfaces of the through vias 112, die connectors 126, and encapsulant 130 are coplanar after the grinding process. In some embodiments, the grinding may be omitted, for example, if through vias 112 and die connectors 126 are already exposed.

In FIGS. 6 through 15 and 19, a front-side redistribution structure 160 is formed. As will be illustrated in FIG. 19, the front-side redistribution structure 160 includes dielectric layers 132, 140, 148, and 156 and metallization patterns 138, 146, and 154 (sometimes referred to as redistribution layers 138, 146, and 154 or redistribution lines 138, 146, and 154).

Figure 6:
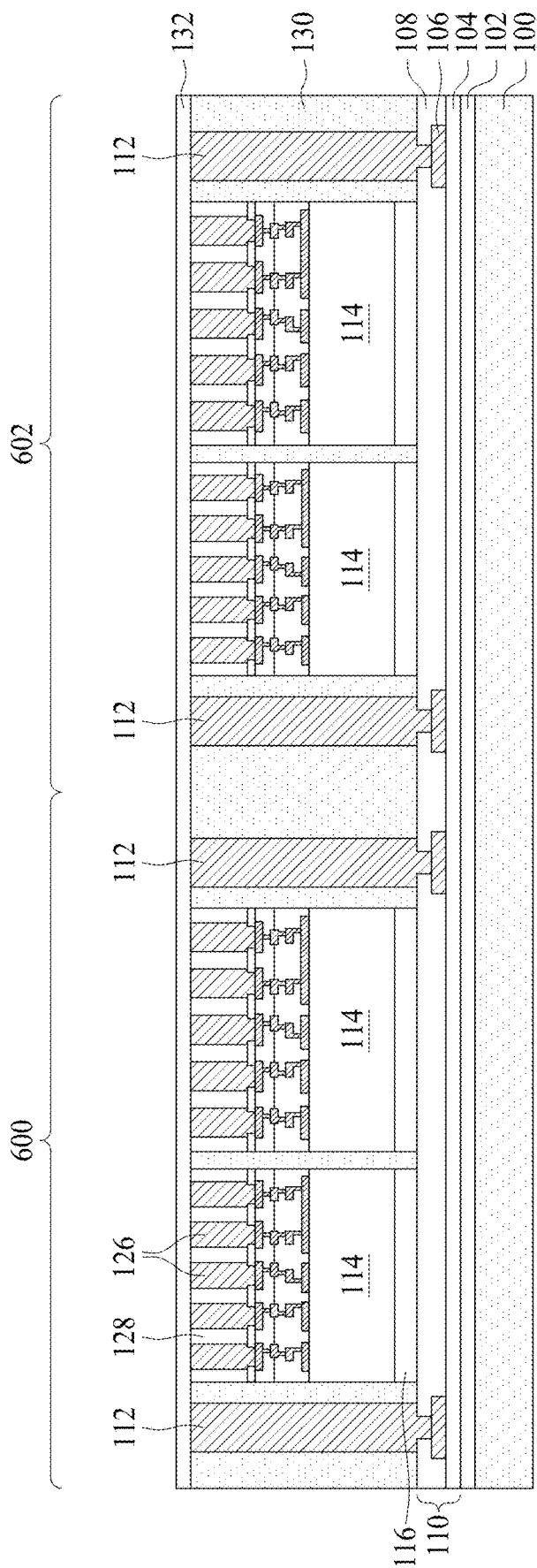

In FIG. 6, the dielectric layer 132 is deposited on the encapsulant 130, through vias 112, and die connectors 126. In some embodiments, the dielectric layer 132 is formed of a polymer, which may be a photo-sensitive material such as PBO, polyimide, BCB, or the like, that may be patterned using a lithography mask. In other embodiments, the dielectric layer 132 is formed of a nitride such as silicon nitride; an oxide such as silicon oxide, PSG, BSG, BPSG; or the like. The dielectric layer 132 may be formed by spin coating, lamination, CVD, the like, or a combination thereof.

Figure 7:
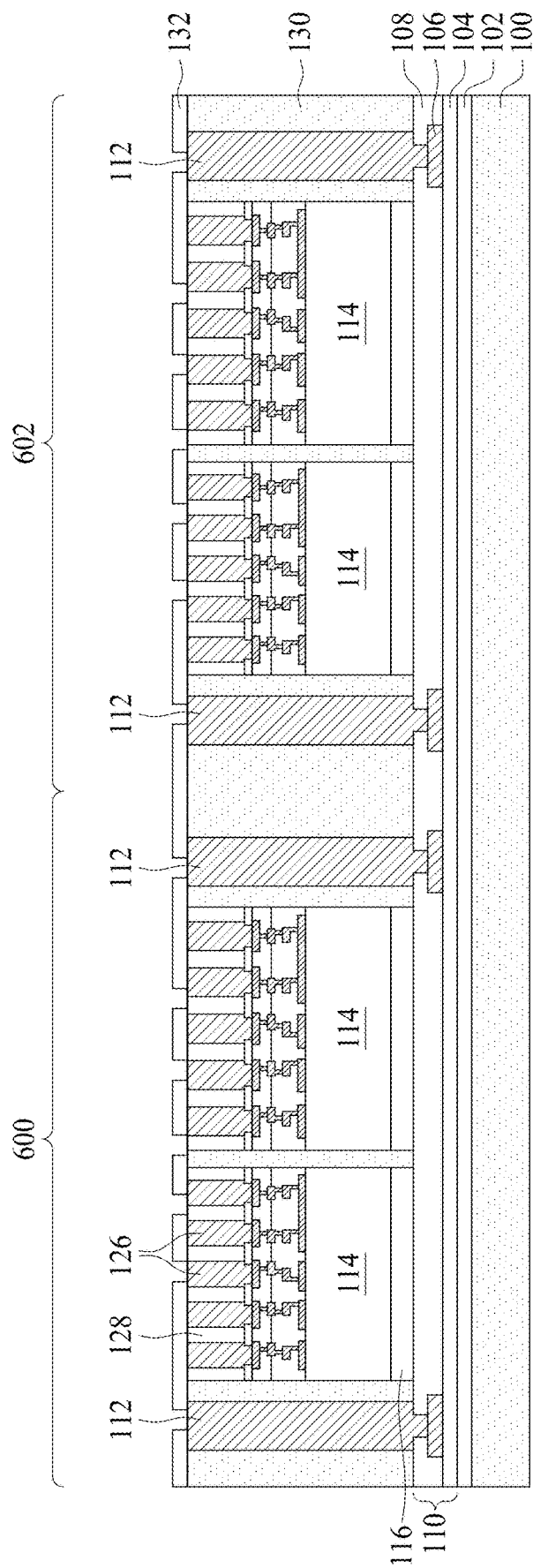

In FIG. 7, the dielectric layer 132 is then patterned. The patterning forms openings to expose portions of the through vias 112 and the die connectors 126. The patterning may be by an acceptable process, such as by exposing the dielectric layer 132 to light when the dielectric layer 132 is a photo-sensitive material or by etching using, for example, an anisotropic etch. If the dielectric layer 132 is a photo-sensitive material, the dielectric layer 132 can be developed after the exposure.

Figure 8:
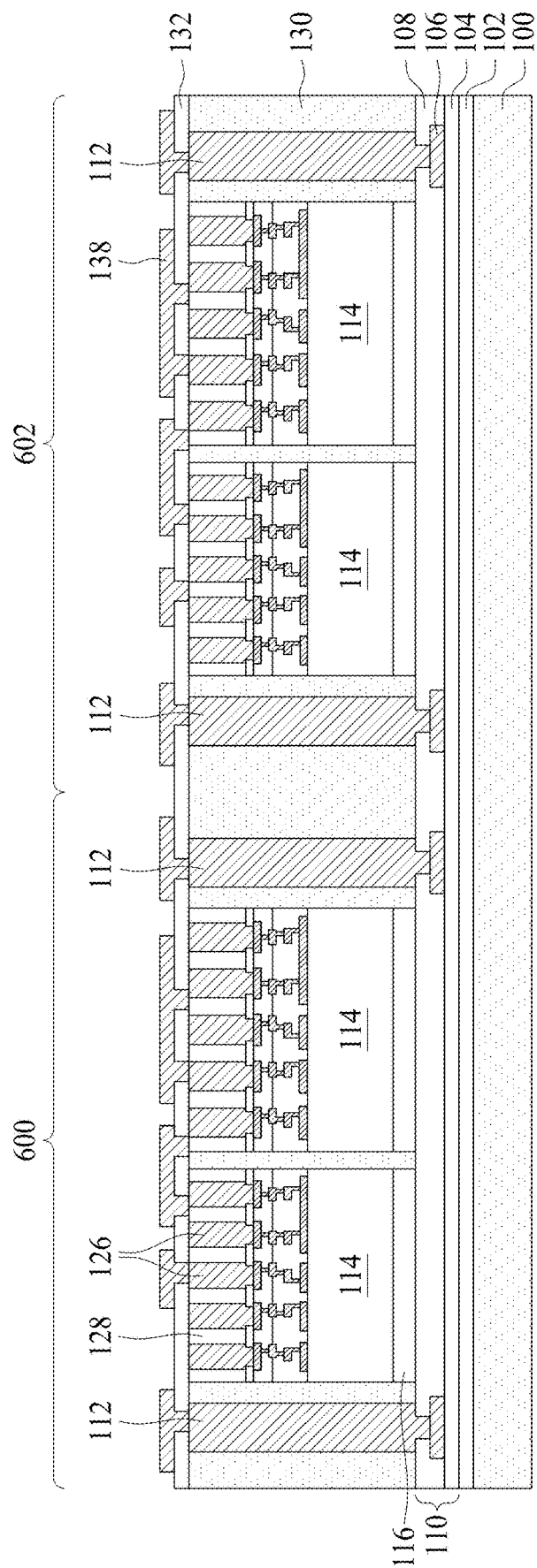

In FIG. 8, metallization pattern 138 with vias is formed on the dielectric layer 132. As an example to form metallization pattern 138, a seed layer (not shown) is formed over the dielectric layer 132 and in openings through the dielectric layer 132. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 138. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 138 and vias. The vias are formed in openings through the dielectric layer 132 to, e.g., the through vias 112 and/or the die connectors 126.

Figure 9:
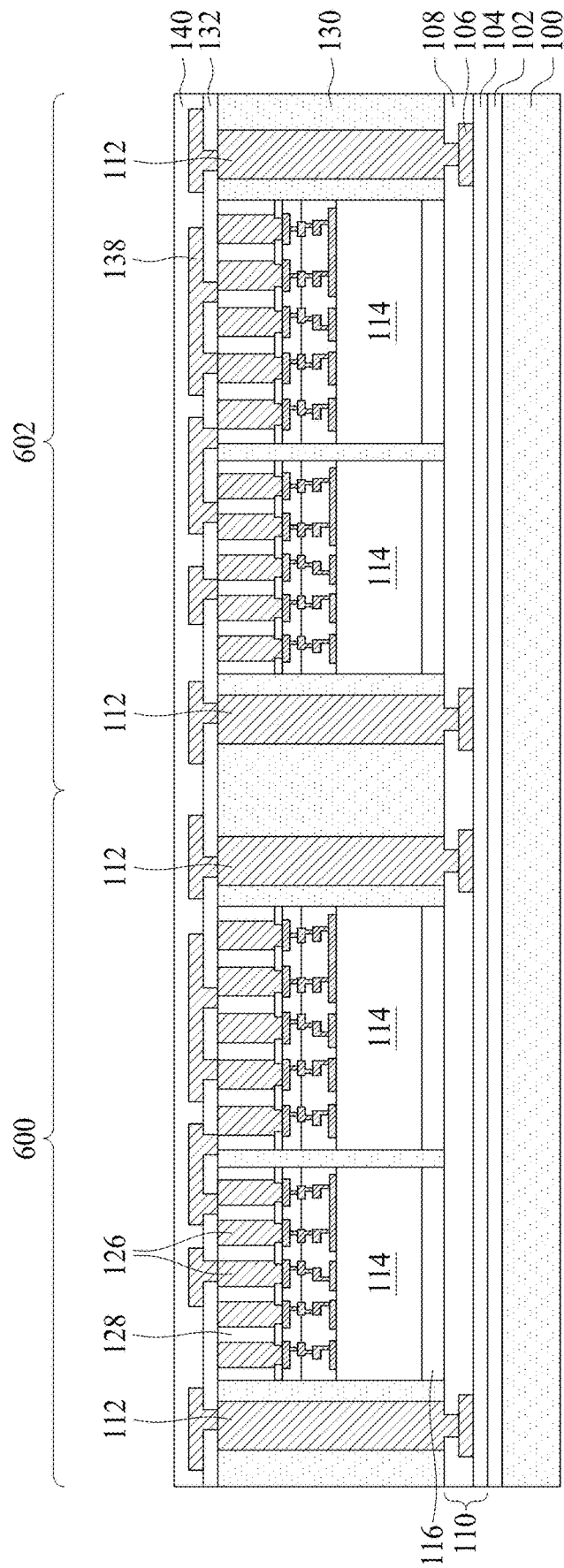

In FIG. 9, the dielectric layer 140 is deposited on the metallization pattern 138 and the dielectric layer 132. In some embodiments, the dielectric layer 140 is formed of a polymer, which may be a photo-sensitive material such as PBO, polyimide, BCB, or the like, that may be patterned using a lithography mask. In other embodiments, the dielectric layer 140 is formed of a nitride such as silicon nitride; an oxide such as silicon oxide, PSG, BSG, BPSG; or the like. The dielectric layer 140 may be formed by spin coating, lamination, CVD, the like, or a combination thereof.

Figure 10:
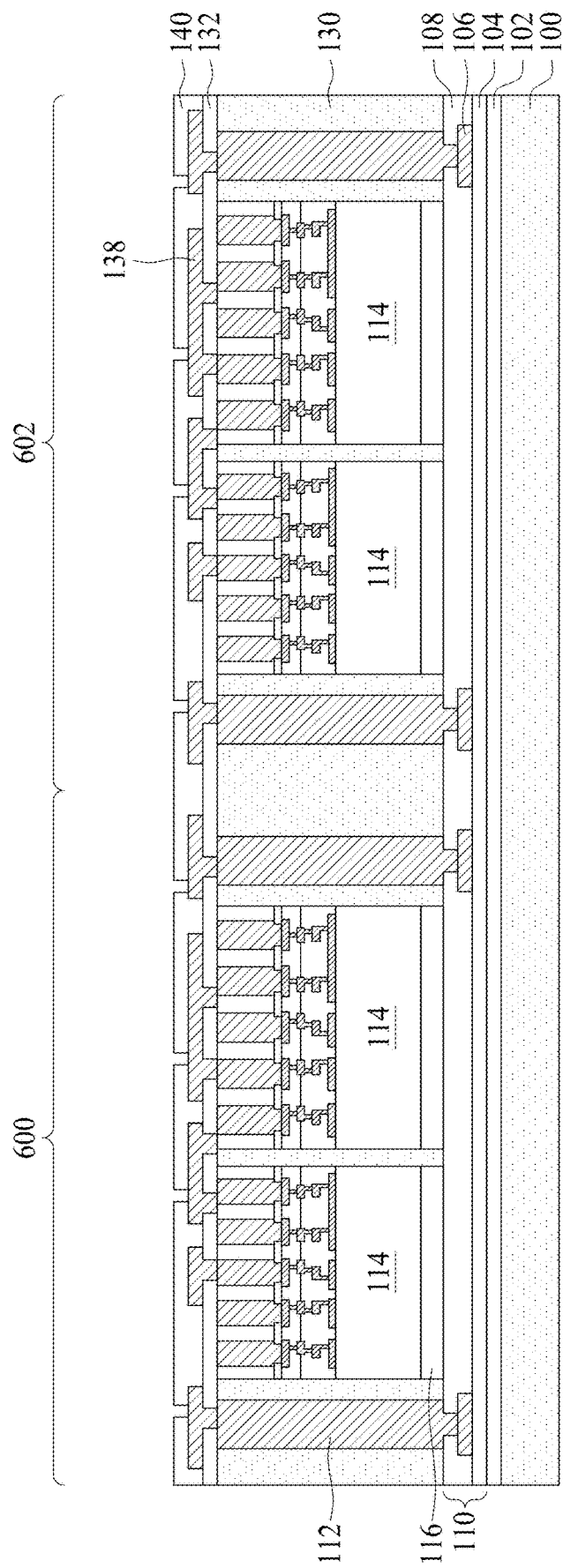

In FIG. 10, the dielectric layer 140 is then patterned. The patterning forms openings to expose portions of the metallization pattern 138. The patterning may be by an acceptable process, such as by exposing the dielectric layer 140 to light when the dielectric layer is a photo-sensitive material or by etching using, for example, an anisotropic etch. If the dielectric layer 140 is a photo-sensitive material, the dielectric layer 140 can be developed after the exposure.

Figure 11:
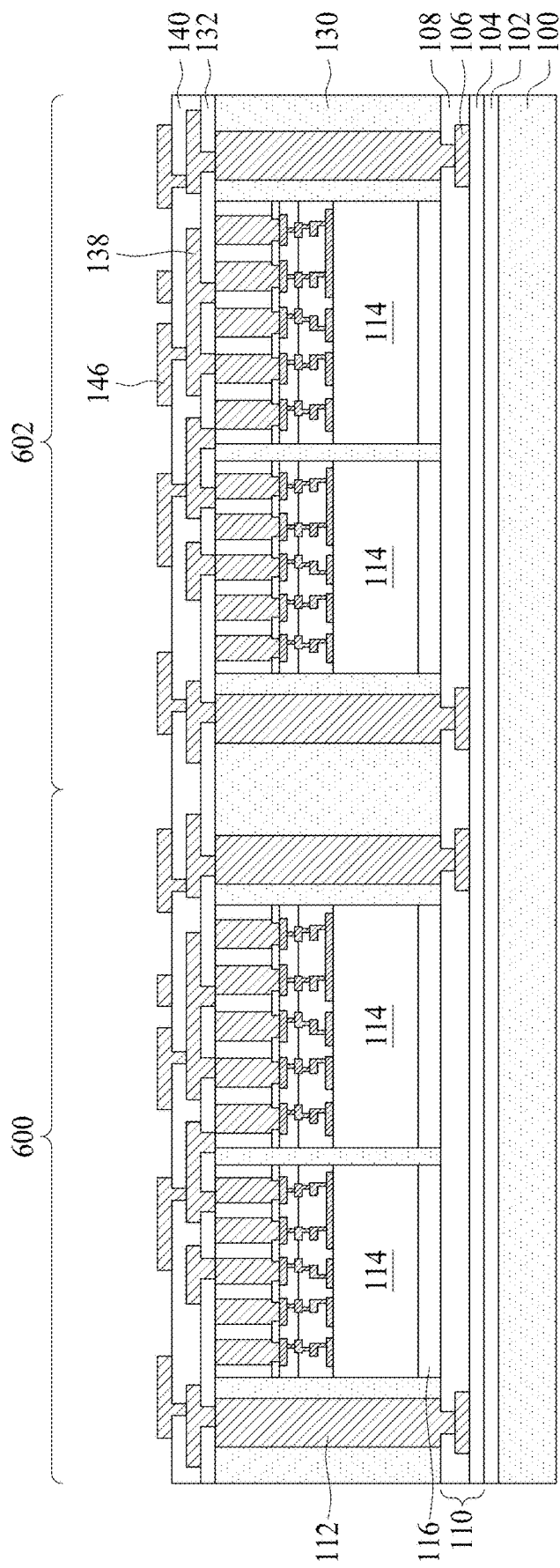

In FIG. 11, metallization pattern 146 with vias is formed on the dielectric layer 140. As an example to form metallization pattern 146, a seed layer (not shown) is formed over the dielectric layer 140 and in openings through the dielectric layer 140. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 146. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 146 and vias. The vias are formed in openings through the dielectric layer 140 to, e.g., portions of the metallization pattern 138.

Figure 12:
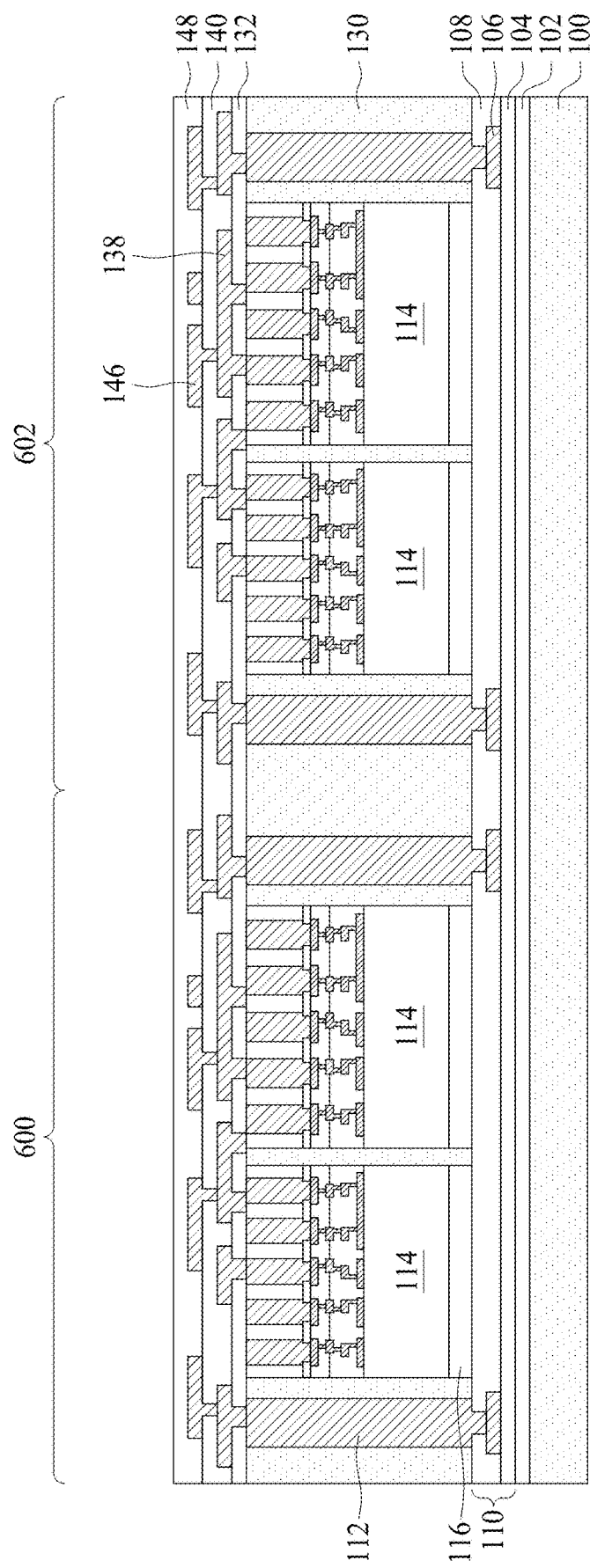

In FIG. 12, the dielectric layer 148 is deposited on the metallization pattern 146 and the dielectric layer 140. In some embodiments, the dielectric layer 148 is formed of a polymer, which may be a photo-sensitive material such as PBO, polyimide, BCB, or the like, that may be patterned using a lithography mask. In other embodiments, the dielectric layer 148 is formed of a nitride such as silicon nitride; an oxide such as silicon oxide, PSG, BSG, BPSG; or the like. The dielectric layer 148 may be formed by spin coating, lamination, CVD, the like, or a combination thereof.

Figure 13:
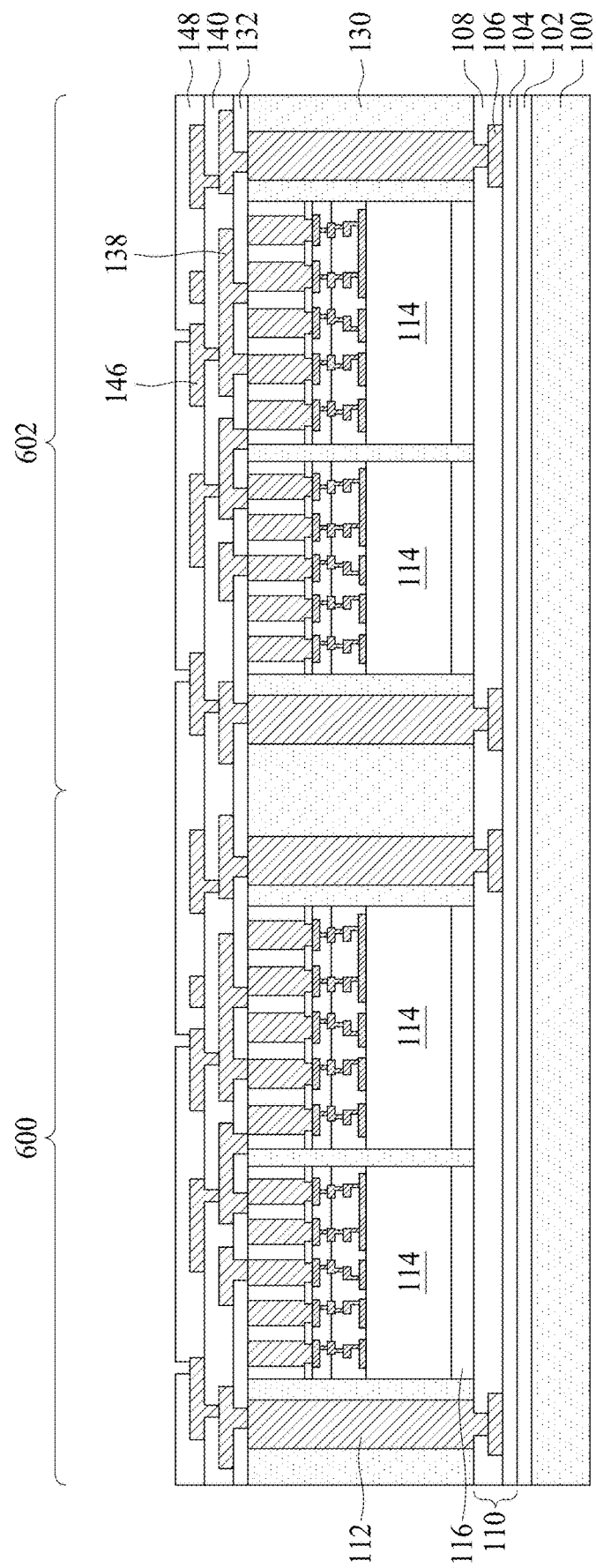

In FIG. 13, the dielectric layer 148 is then patterned. The patterning forms openings to expose portions of the metallization pattern 146. The patterning may be by an acceptable process, such as by exposing the dielectric layer 148 to light when the dielectric layer is a photo-sensitive material or by etching using, for example, an anisotropic etch. If the dielectric layer 148 is a photo-sensitive material, the dielectric layer 148 can be developed after the exposure.

Figure 14:
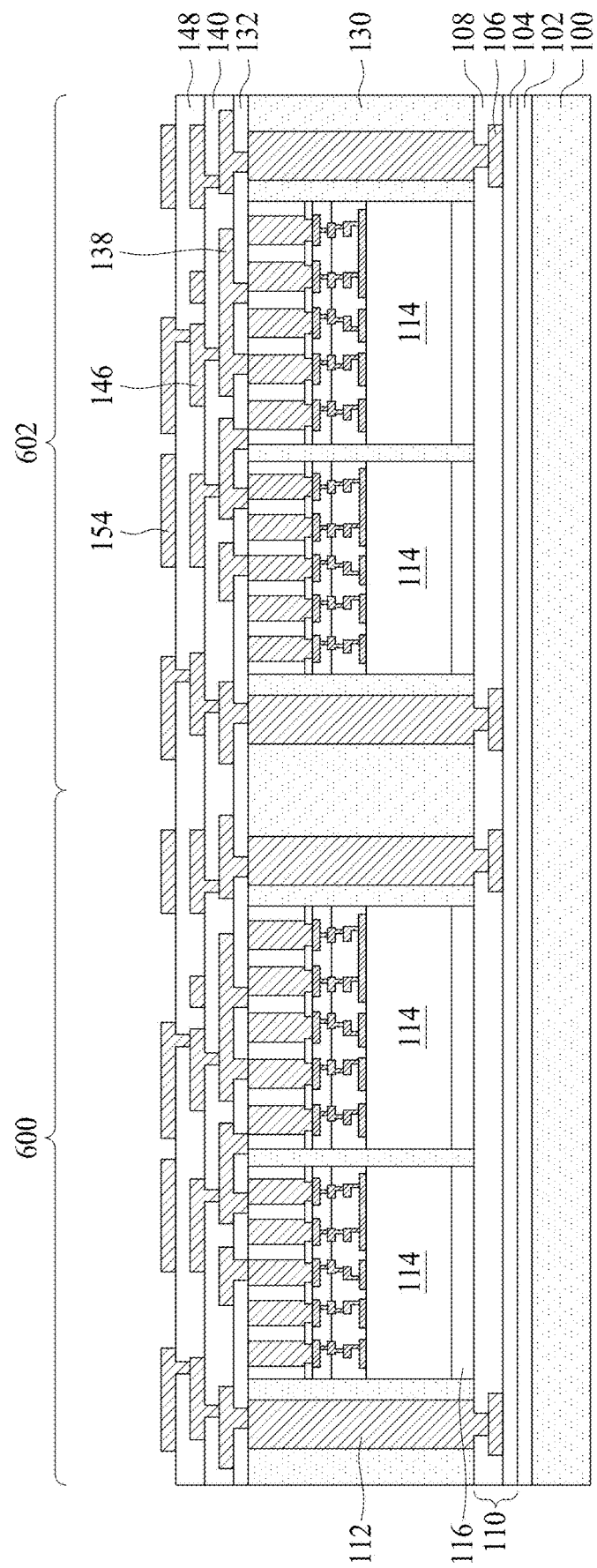

In FIG. 14, metallization pattern 154 with vias is formed on the dielectric layer 148. As an example to form metallization pattern 154, a seed layer (not shown) is formed over the dielectric layer 148 and in openings through the dielectric layer 148. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 154. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 154 and vias. The vias are formed in openings through the dielectric layer 148 to, e.g., portions of the metallization pattern 146.

Figure 15:
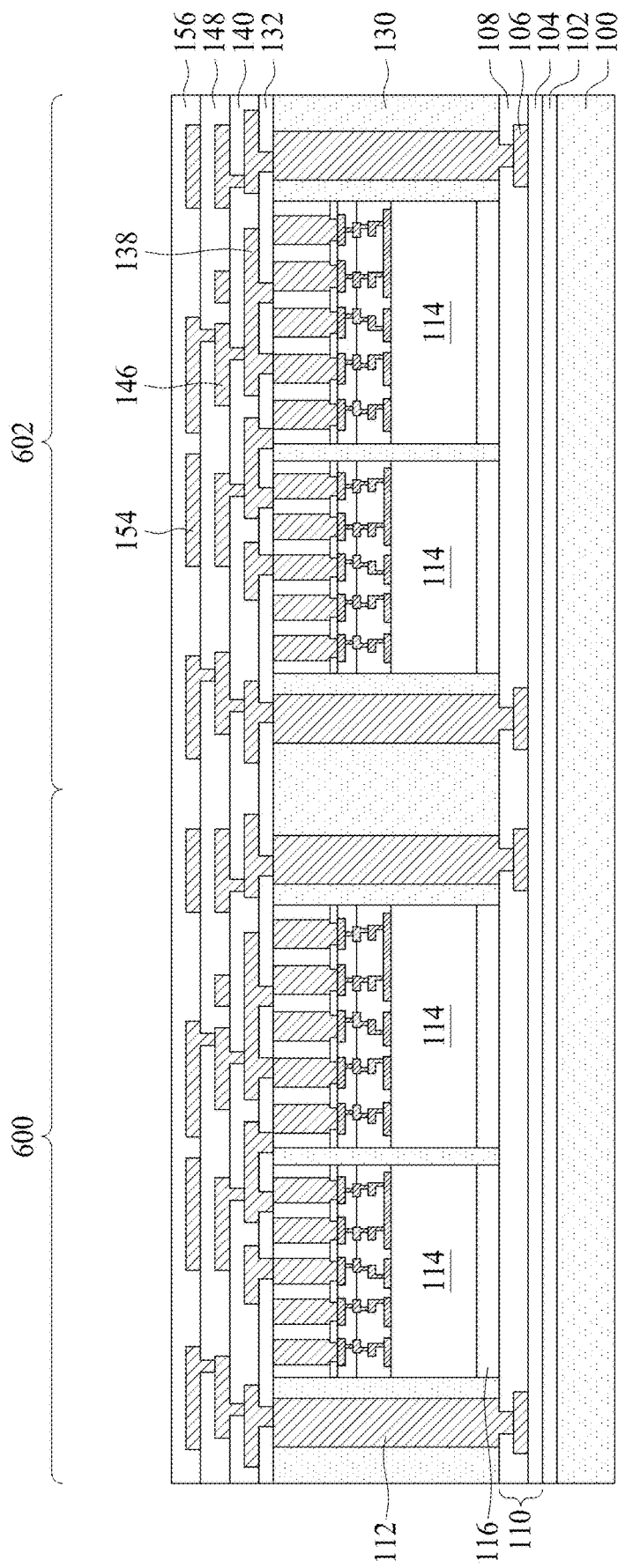

In FIG. 15, the dielectric layer 156 is deposited on the metallization pattern 154 and the dielectric layer 148. In some embodiments, the dielectric layer 156 is formed of a polymer, which may be a photo-sensitive material such as PBO, polyimide, BCB, or the like, that may be patterned using a lithography mask. In other embodiments, the dielectric layer 156 is formed of a nitride such as silicon nitride; an oxide such as silicon oxide, PSG, BSG, BPSG; or the like. The dielectric layer 156 may be formed by spin coating, lamination, CVD, the like, or a combination thereof.

Figure 16:
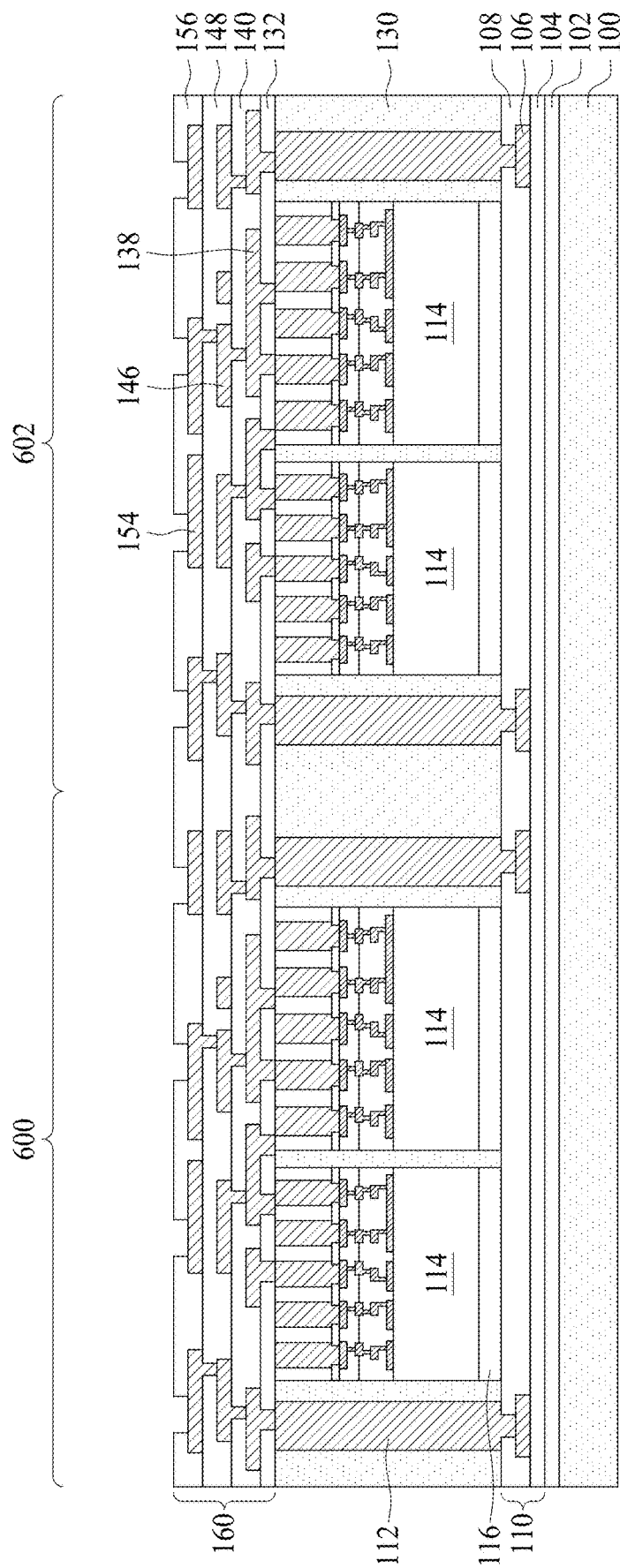

In FIG. 16, the dielectric layer 156 is then patterned. The patterning forms openings to expose portions of the metallization pattern 154. The patterning may be by an acceptable process, such as by exposing the dielectric layer 156 to light when the dielectric layer is a photo-sensitive material or by etching using, for example, an anisotropic etch. If the dielectric layer 156 is a photo-sensitive material, the dielectric layer 156 can be developed after the exposure.

The front-side redistribution structure 160 is shown as an example. More or fewer dielectric layers and metallization patterns may be formed in the front-side redistribution structure 160. If fewer dielectric layers and metallization patterns are to be formed, steps and process discussed above may be omitted. If more dielectric layers and metallization patterns are to be formed, steps and processes discussed above may be repeated. One having ordinary skill in the art will readily understand which steps and processes would be omitted or repeated.

Figure 17:
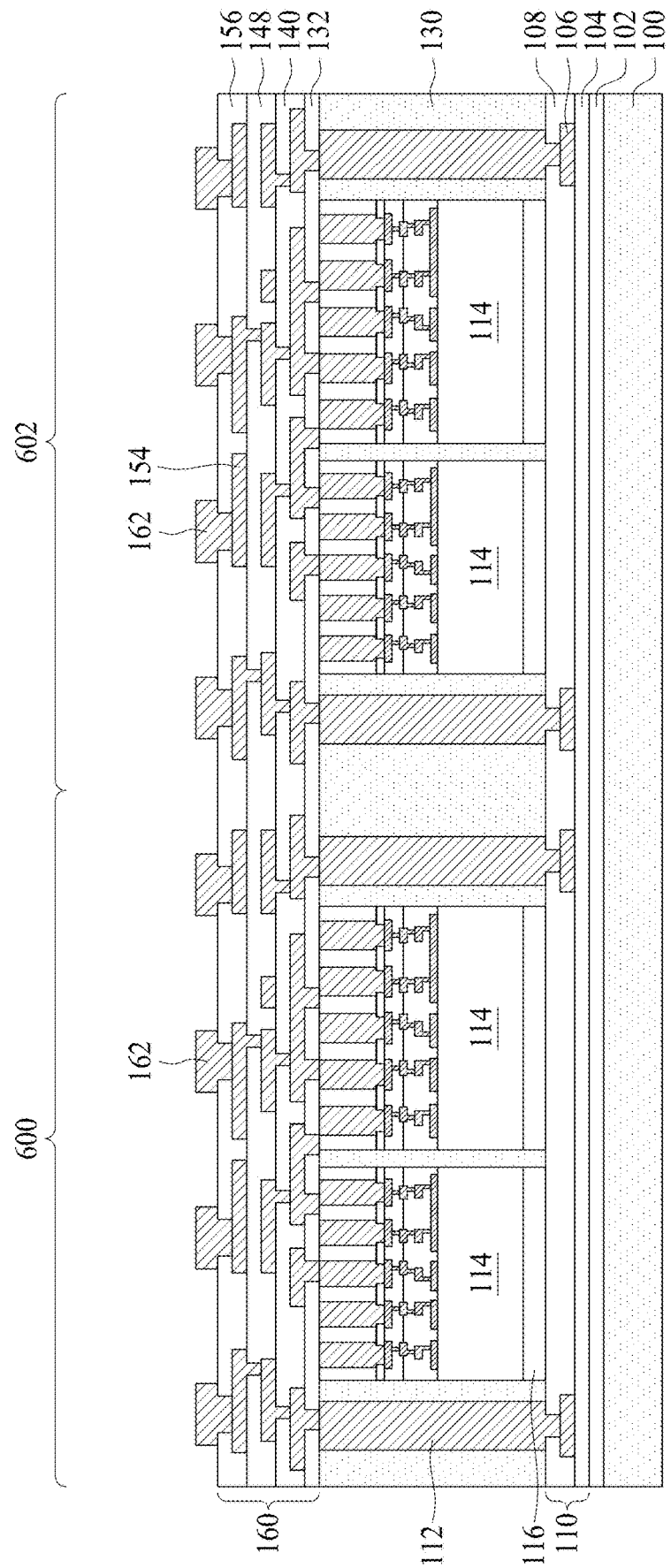

In FIG. 17, pads 162 are formed on an exterior side of the front-side redistribution structure 160. The pads 162 are used to couple to conductive connectors 166 (see FIG. 21) and may be referred to as under bump metallurgies (UBMs) 162. In the illustrated embodiment, the pads 162 are formed through openings through the dielectric layer 156 to the metallization pattern 154. As an example to form the pads 162, a seed layer (not shown) is formed over the dielectric layer 156. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the pads 162. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the pads 162. In the embodiment, where the pads 162 are formed differently, more photo resist and patterning steps may be utilized.

Figure 18:
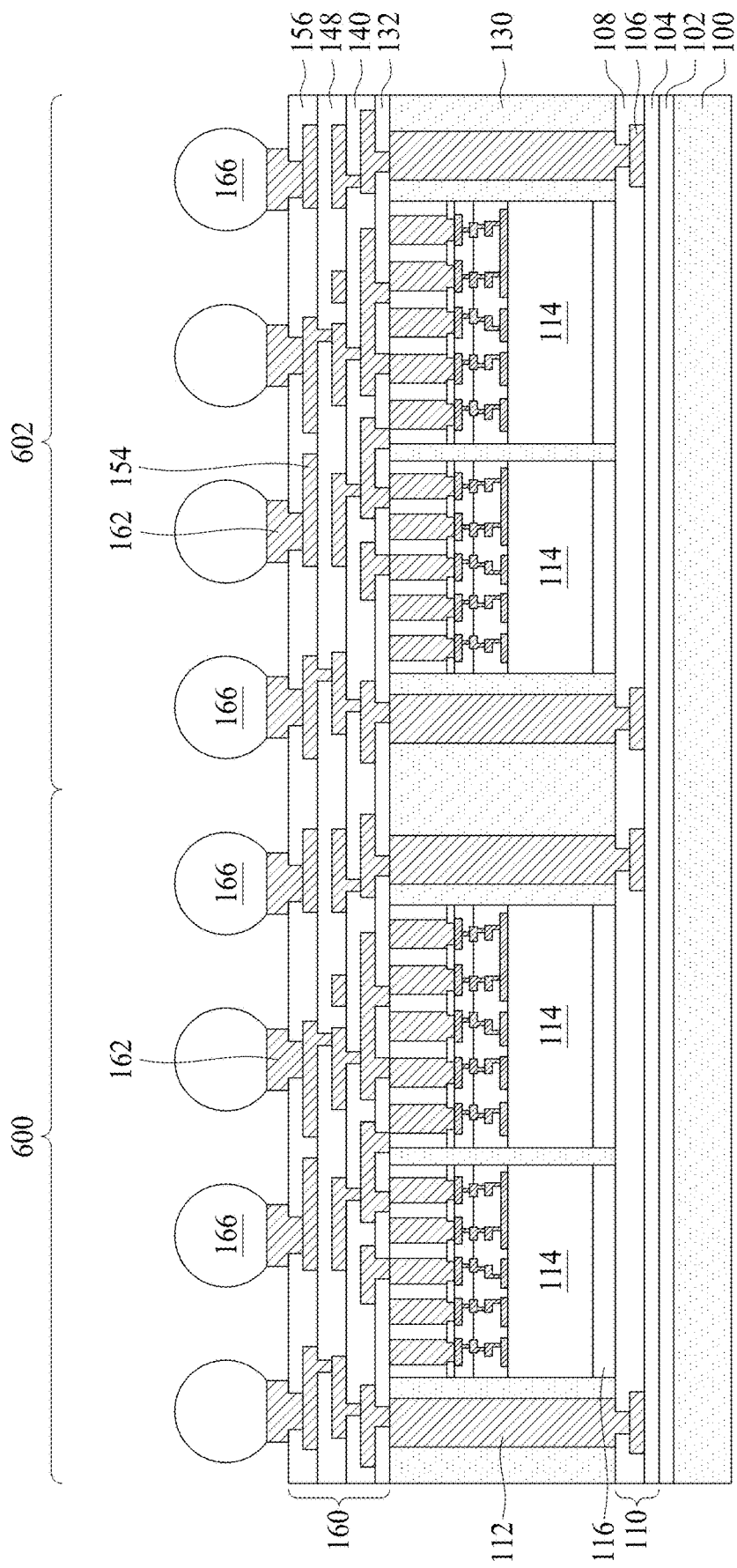

In FIG. 18, conductive connectors 166 are formed on the UBMs 162. The conductive connectors 166 may be BGA connectors, solder balls, metal pillars, controlled collapse chip connection (C4) bumps, micro bumps, electroless nickel-electroless palladium-immersion gold technique (ENEPIG) formed bumps, or the like. The conductive connectors 166 may include a conductive material such as solder, copper, aluminum, gold, nickel, silver, palladium, tin, the like, or a combination thereof. In some embodiments, the conductive connectors 166 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 166 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the metal pillar connectors 166. The metal cap layer may include nickel, tin, tin-lead, gold, silver, palladium, indium, nickel-palladium-gold, nickel-gold, the like, or a combination thereof and may be formed by a plating process.

Figure 19:
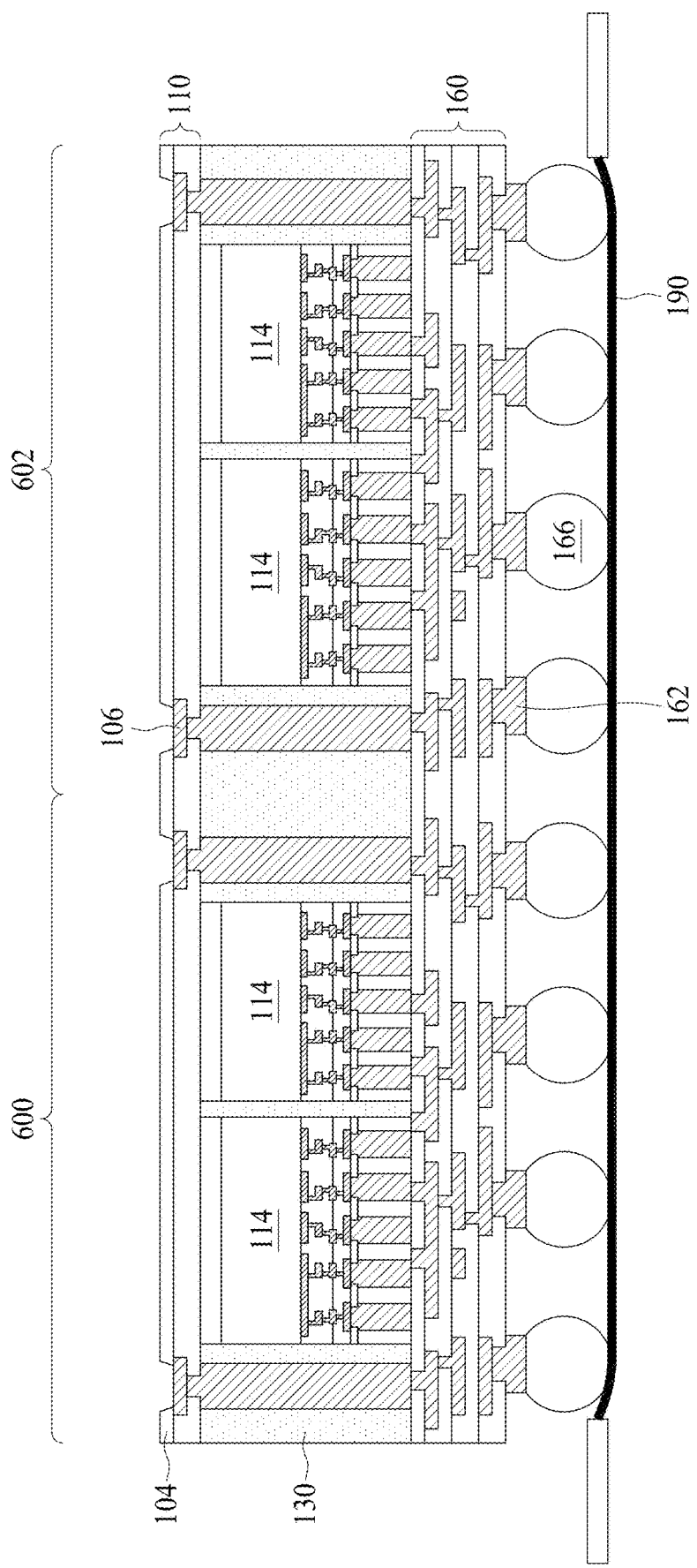

In FIG. 19, a carrier substrate de-bonding is performed to detach (de-bond) the carrier substrate 100 from the back-side redistribution structure, e.g., dielectric layer 104. In accordance with some embodiments, the de-bonding includes projecting a light such as a laser light or an UV light on the release layer 102 so that the release layer 102 decomposes under the heat of the light and the carrier substrate 100 can be removed. The structure is then flipped over and placed on a tape 190.

As further illustrated in FIG. 19, openings are formed through the dielectric layer 104 to expose portions of the metallization pattern 106. The openings may be formed, for example, using laser drilling, etching, or the like.

Figure 20:
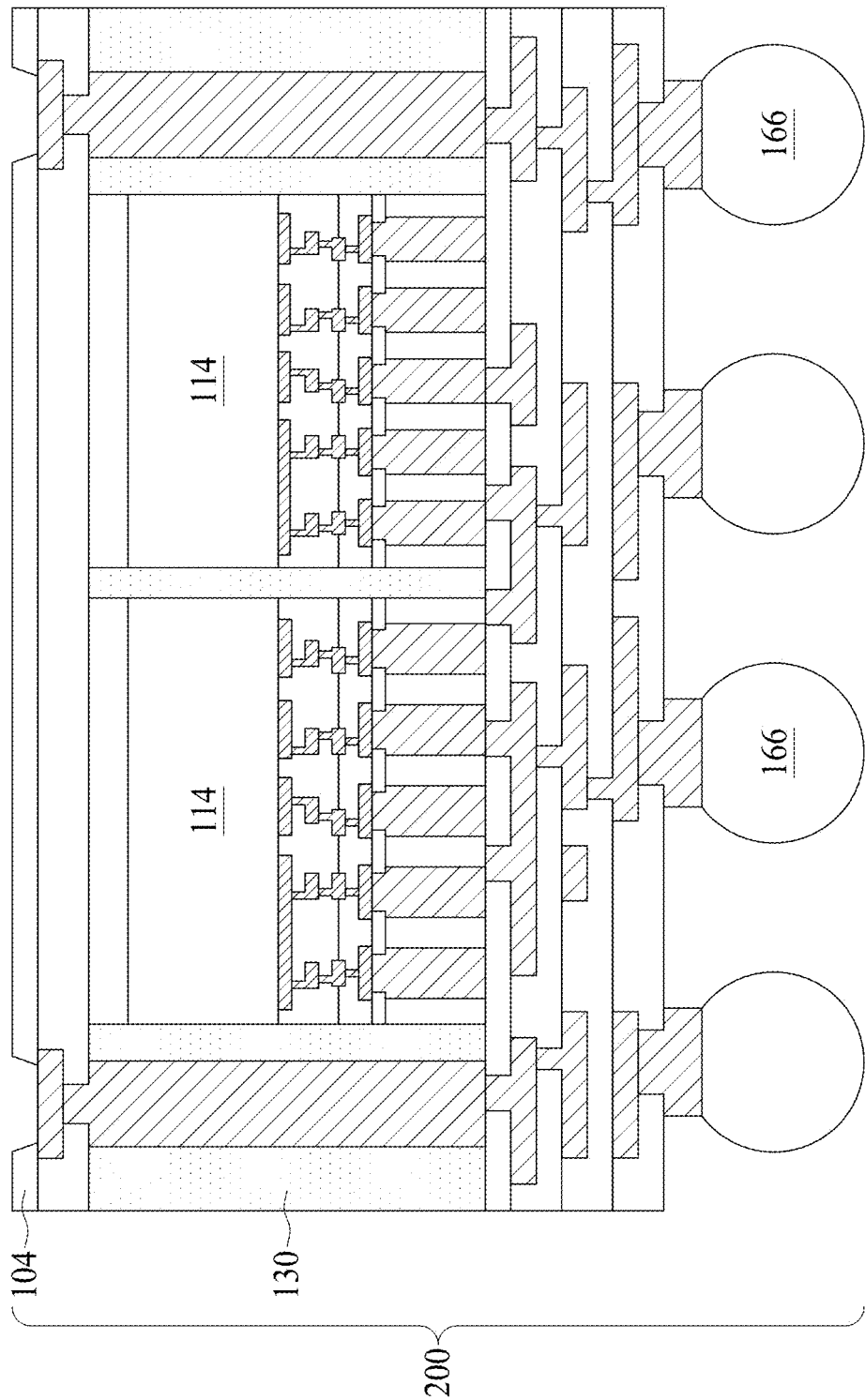

In FIG. 20, a singulation process is performed by sawing 184 along scribe line regions e.g., between adjacent regions 600 and 602. The sawing 184 singulates the first package region 600 from the second package region 602.

FIG. 20 illustrates a resulting, singulated package 200, which may be from one of the first package region 600 or the second package region 602. The package 200 may also be referred to as an integrated fan-out (InFO) package 200.

Figure 21A:
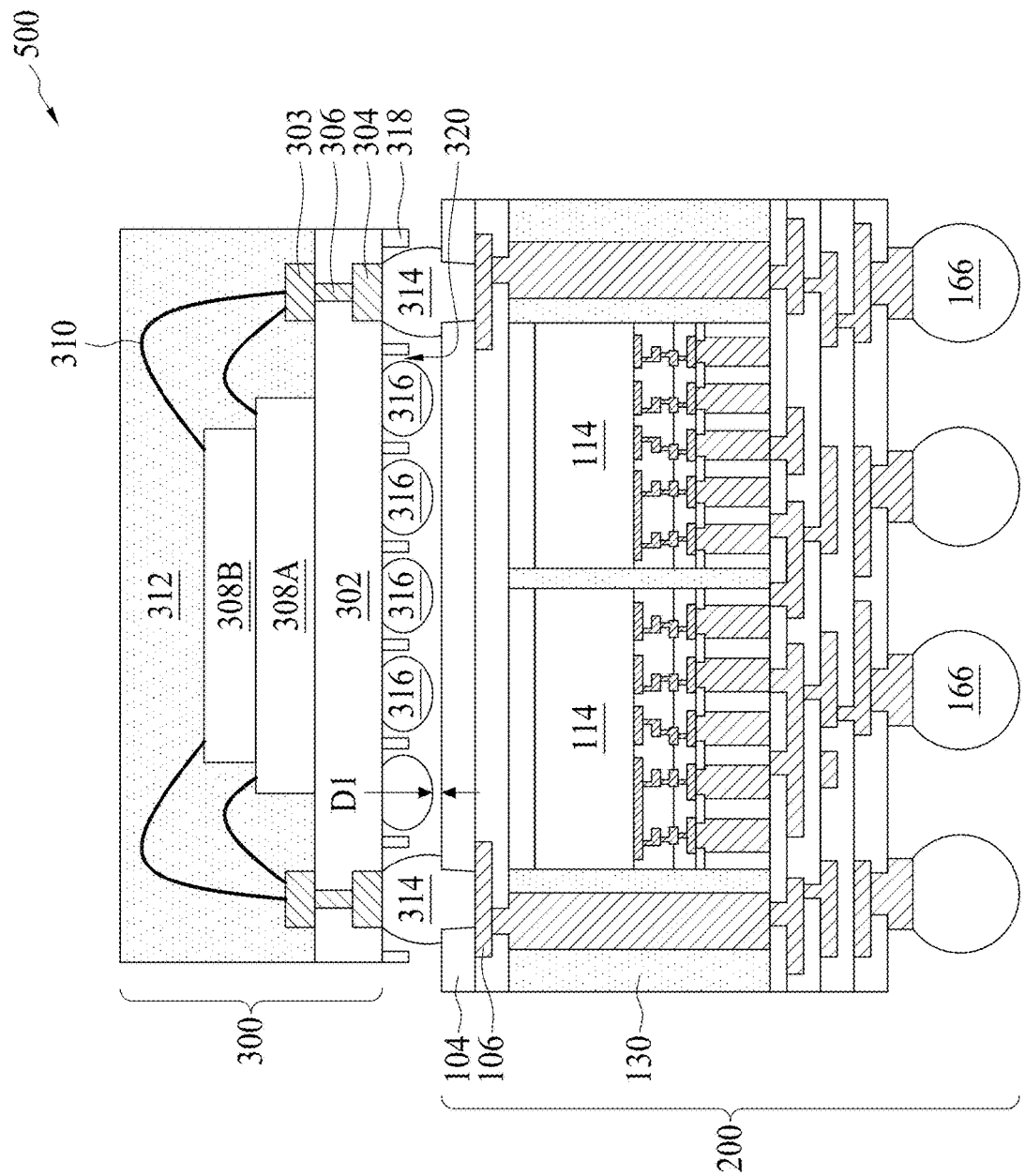
Figure 21B:
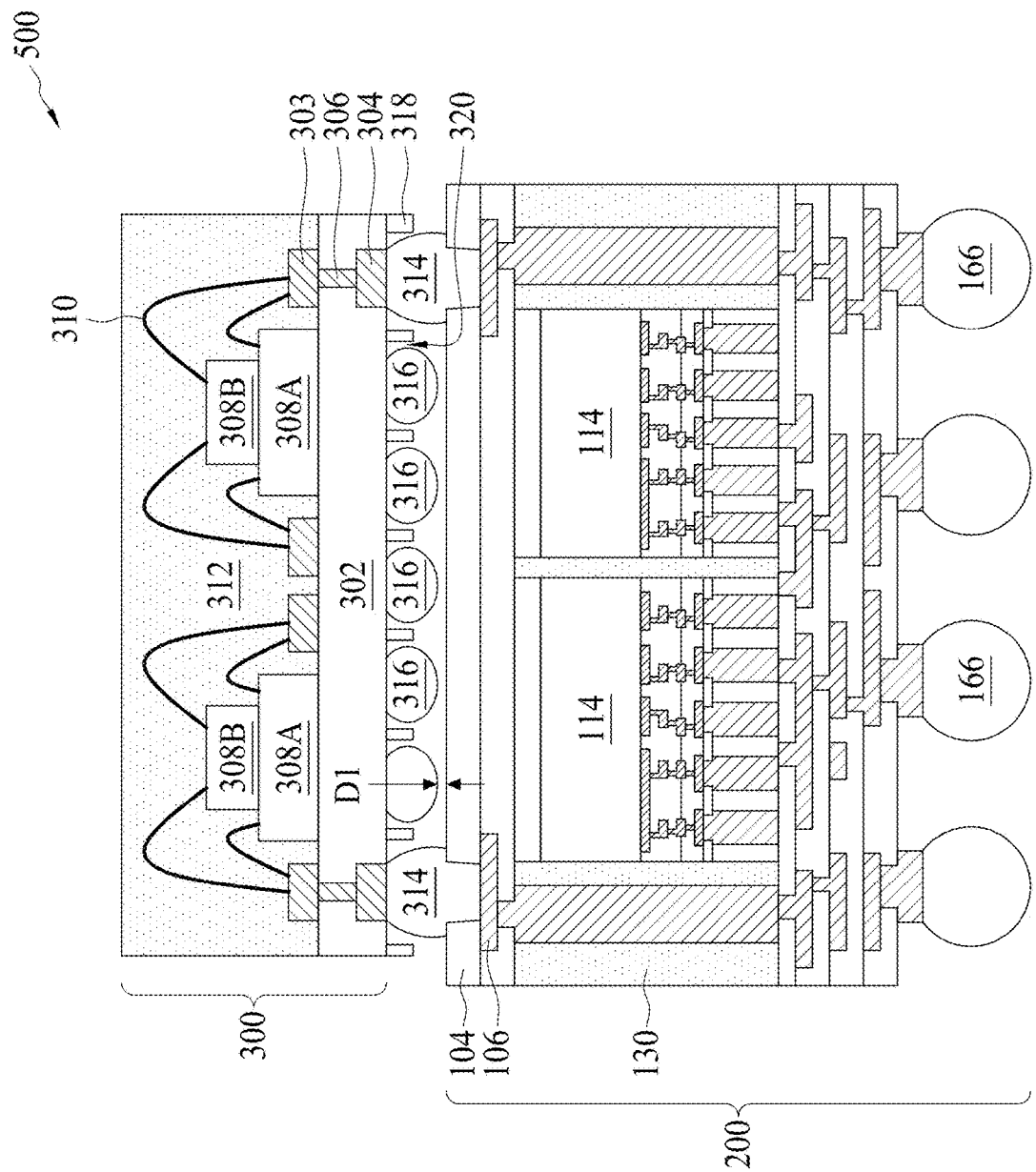

FIG. 21A illustrates a package structure 500 including the package 200 (may be referred to as a first package 200) and a second package 300. The second package 300 includes a substrate 302 and one or more stacked dies 308 (308A and 308B) coupled to the substrate 302. Although a singular stack of dies 308 (308A and 308B) is illustrated, in other embodiments, a plurality of stacked dies 308 (each having one or more stacked dies) may be disposed side by side coupled to a same surface of the substrate 302 (e.g., see FIG. 21B). Referring back to FIG. 21A, the substrate 302 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 302 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 302 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate 302.

The substrate 302 may include active and passive devices (not shown in FIG. 21). As one of ordinary skill in the art will recognize, a wide variety of devices such as transistors, capacitors, resistors, combinations of these, and the like may be used to generate the structural and functional requirements of the design for the semiconductor package 300. The devices may be formed using any suitable methods.

The substrate 302 may also include metallization layers (not shown) and through vias 306. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate 302 is substantially free of active and passive devices.

The substrate 302 may have bond pads 303 on a first side the substrate 202 to couple to the stacked dies 308, and bond pads 304 on a second side of the substrate 302, the second side being opposite the first side of the substrate 302, to couple to the functional connectors 314. In some embodiments, the bond pads 303 and 304 are formed by forming recesses (not shown) into dielectric layers (not shown) on the first and second sides of the substrate 302. The recesses may be formed to allow the bond pads 303 and 304 to be embedded into the dielectric layers. In other embodiments, the recesses are omitted as the bond pads 303 and 304 may be formed on the dielectric layer. In some embodiments, the bond pads 303 and 304 include a thin seed layer (not shown) made of copper, titanium, nickel, gold, palladium, the like, or a combination thereof. The conductive material of the bond pads 303 and 304 may be deposited over the thin seed layer. The conductive material may be formed by an electrochemical plating process, an electroless plating process, CVD, ALD, PVD, the like, or a combination thereof. In an embodiment, the conductive material of the bond pads 303 and 304 is copper, tungsten, aluminum, silver, gold, the like, or a combination thereof.

In an embodiment, the bond pads 303 and 304 are UBMs that include three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBMs 303 and 304. Any suitable materials or layers of material that may be used for the UBMs 303 and 304 are fully intended to be included within the scope of the current application. In some embodiments, the through vias 306 extend through the substrate 302 and couple at least one bond pad 303 to at least one bond pad 304.

In the illustrated embodiment, the stacked dies 308 are coupled to the substrate 302 by wire bonds 310, although other connections may be used, such as conductive bumps. In an embodiment, the stacked dies 308 are stacked memory dies. For example, the stacked memory dies 308 may include low-power (LP) double data rate (DDR) memory modules, such as LPDDR1, LPDDR2, LPDDR3, LPDDR4, or the like memory modules.

In some embodiments, the stacked dies 308 and the wire bonds 310 may be encapsulated by a molding material 312. The molding material 312 may be molded on the stacked dies 308 and the wire bonds 310, for example, using compression molding. In some embodiments, the molding material 312 is a molding compound, a polymer, an epoxy, silicon oxide filler material, the like, or a combination thereof. A curing step may be performed to cure the molding material 312, wherein the curing may be a thermal curing, a UV curing, the like, or a combination thereof.

In some embodiments, the stacked dies 308 and the wire bonds 310 are buried in the molding material 312, and after the curing of the molding material 312, a planarization step, such as a grinding, is performed to remove excess portions of the molding material 312 and provide a substantially planar surface for the second packages 300.

After the second packages 300 are formed, the packages 300 are mechanically and electrically bonded to the first packages 200 by way of functional connectors 314, the bond pads 304, and the metallization pattern 106. In some embodiments, the stacked memory dies 308 may be coupled to the integrated circuit dies 114 through the wire bonds 310, the bond pads 303 and 304, through vias 306, the functional connectors 314, and the through vias 112.

The functional connectors 314 may be similar to the conductive connectors 166 described above and the description is not repeated herein, although the functional connectors 314 and the conductive connectors 166 need not be the same. The functional connectors 314 may be disposed on an opposing side of the substrate 302 as the stacked memory dies 308. In some embodiments, a solder resist 318 may also be formed on the side of the substrate 302 opposing the stacked memory dies 308. The functional connectors 314 may be disposed in openings in the solder resist 318 to be electrically and mechanically coupled to conductive features (e.g., the bond pads 304) in the substrate 302. The solder resist 318 may be used to protect areas of the substrate 302 from external damage.

In some embodiments, before bonding the functional connectors 314, the functional connectors 314 are coated with a flux (not shown), such as a no-clean flux. The functional connectors 314 may be dipped in the flux or the flux may be jetted onto the functional connectors 314. In another embodiment, the flux may be applied to the surfaces of the metallization patterns 106.

In some embodiments, the functional connectors 314 may have an optional epoxy flux (not shown) formed thereon before they are reflowed with at least some of the epoxy portion of the epoxy flux remaining after the second package 300 is attached to the first package 200. This remaining epoxy portion may act as an underfill to reduce stress and protect the joints resulting from the reflowing the functional connectors 314.

The bonding between the second package 300 and the first package 200 may be a solder bonding. In an embodiment, the second package 300 is bonded to the first package 200 by a reflow process. During this reflow process, the functional connectors 314 are in contact with the bond pads 304 and the metallization patterns 106 to physically and electrically couple the second package 300 to the first package 200. After the bonding process, an intermetallic compound (IMC, not shown) may form at the interface of the metallization patterns 106 and the functional connectors 314 and also at the interface between the functional connectors 314 and the bond pads 304 (not shown).

The second package 300 may further include dummy connectors 316 disposed on a same surface of the substrate 302 as the functional connectors 314. For example, the dummy connectors 316 may be disposed on a surface of the substrate 302 opposing the stacked memory dies 308, and the dummy connectors may be disposed in openings 320 of the solder resist 318. The dummy connectors 316 may be substantially similar as the functional connectors 314 and the conductive connectors 166. For example, the dummy connectors 316 and the functional connectors 314 may have a same material composition although the dummy connectors 316 and the functional connectors 314 may comprise different materials in other embodiments.

Figure 30:
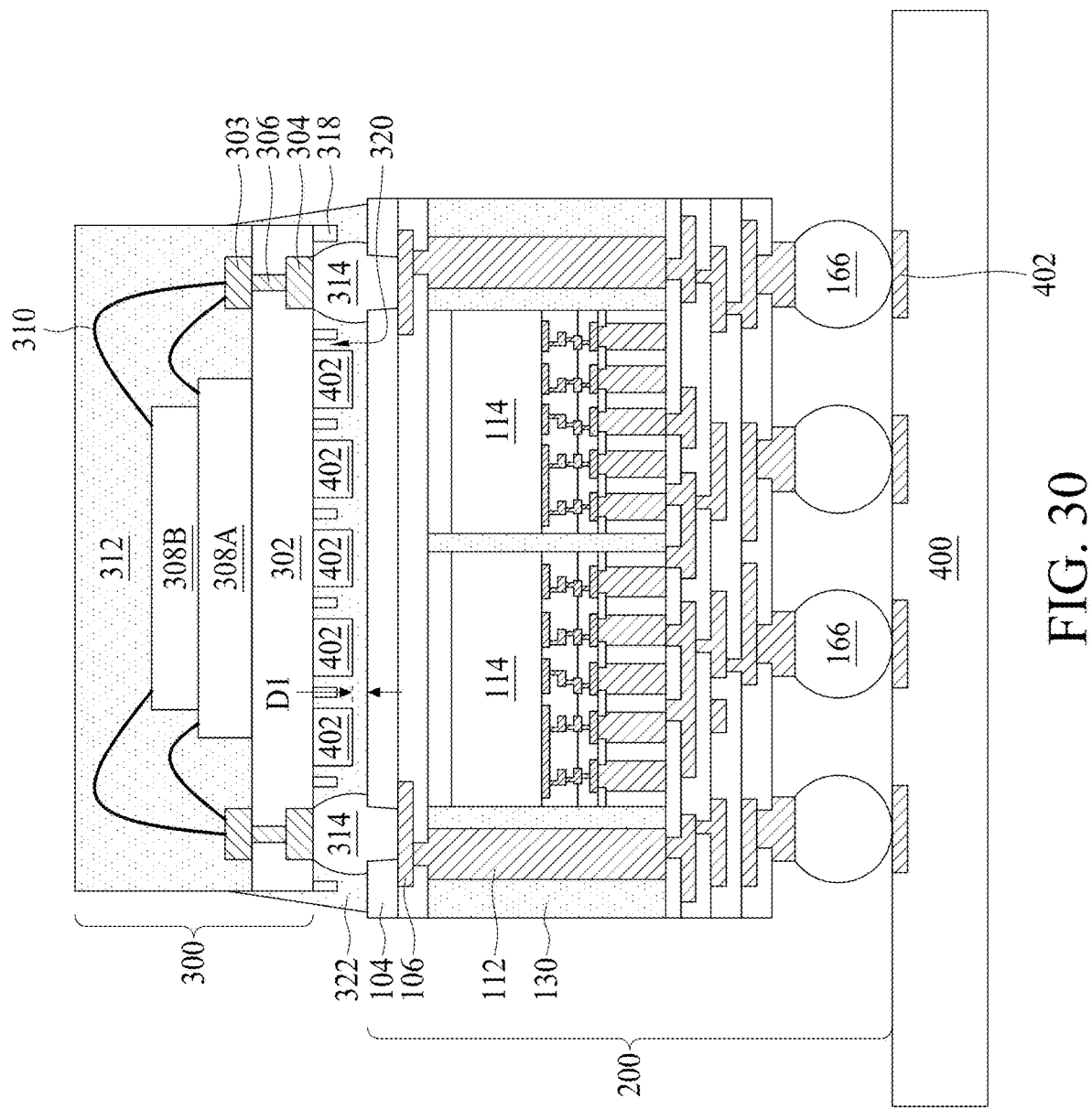
FIG. 30 illustrates a cross-sectional view of semiconductor package according in accordance to some embodiments.
Figure 31C:
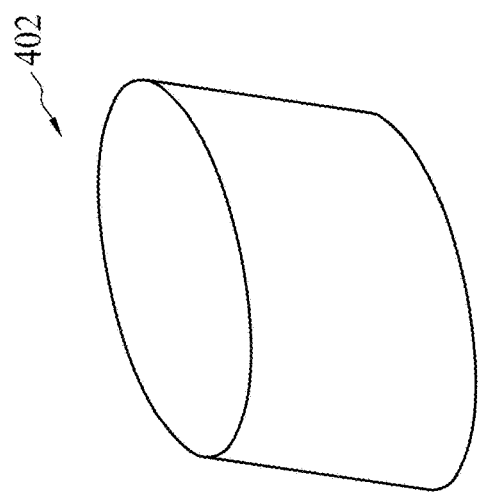
FIGS. 31A, 31B, and 31C illustrate perspective views of dummy connectors in accordance to some embodiments.
Figure 31B:
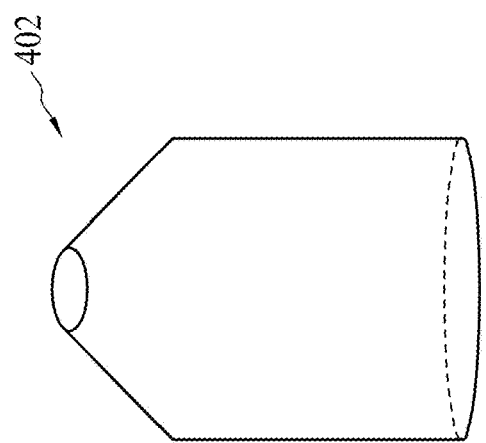
Figure 31A:
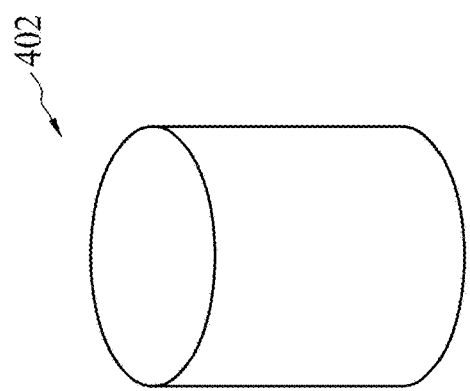

In some embodiments, the dummy connectors 316 may be solder balls (e.g., as illustrated FIGS. 21A and 21B), solder regions disposed on a conductive pillar, or conductive pillars substantially free of solder (see e.g., FIG. 30 illustrating dummy connectors 316 as conductive pillars 402). In embodiments where the dummy connectors 316 are made of conductive pillars 402, the conductive pillars 402 may comprise any suitable material, such as copper, gold, nickel, or the like. For example, the conductive pillars 402 may be made of substantially pure copper, substantially pure gold, substantially pure nickel, or the like. In other embodiments, the conductive pillars 402 may comprise an alloy of different substances. Furthermore, in embodiments where the dummy connectors 316 are made of conductive pillars 402, the conductive pillars 402 may have any suitable shape, such as, a circular prism (see FIG. 31A), a circular cylinder with a truncated cone on one end (e.g., an end distal to the substrate 302) (see FIG. 31B), an oval cylinder (see e.g., FIG. 31C), or any other suitable shape.

In various embodiments, the dummy connectors 316 are not used to mechanically or electrically bond the second package 300 to the first package 200. For example, the dummy connectors 316 may not physically contact or fully bridge a distance between the second package 300 and the first package 200. In some embodiments, a gap is disposed between the dummy connectors 316 and the first package 200, and a distance D1 between the dummy connectors 316 and the first package 200 may be about 10 μm or less. In other embodiments, some or all of the dummy connectors 316 may physically contact the first package 200. The dummy connectors 316 may be electrically isolated from functional circuitry in the first package 200 (e.g., the integrated circuit dies 114), and the dummy connectors 316 may or may not be electrically isolated from functional circuitry in the second package 300 (e.g., the stacked memory dies 308 and/or electrical components in the substrate 302).

Figure 22:
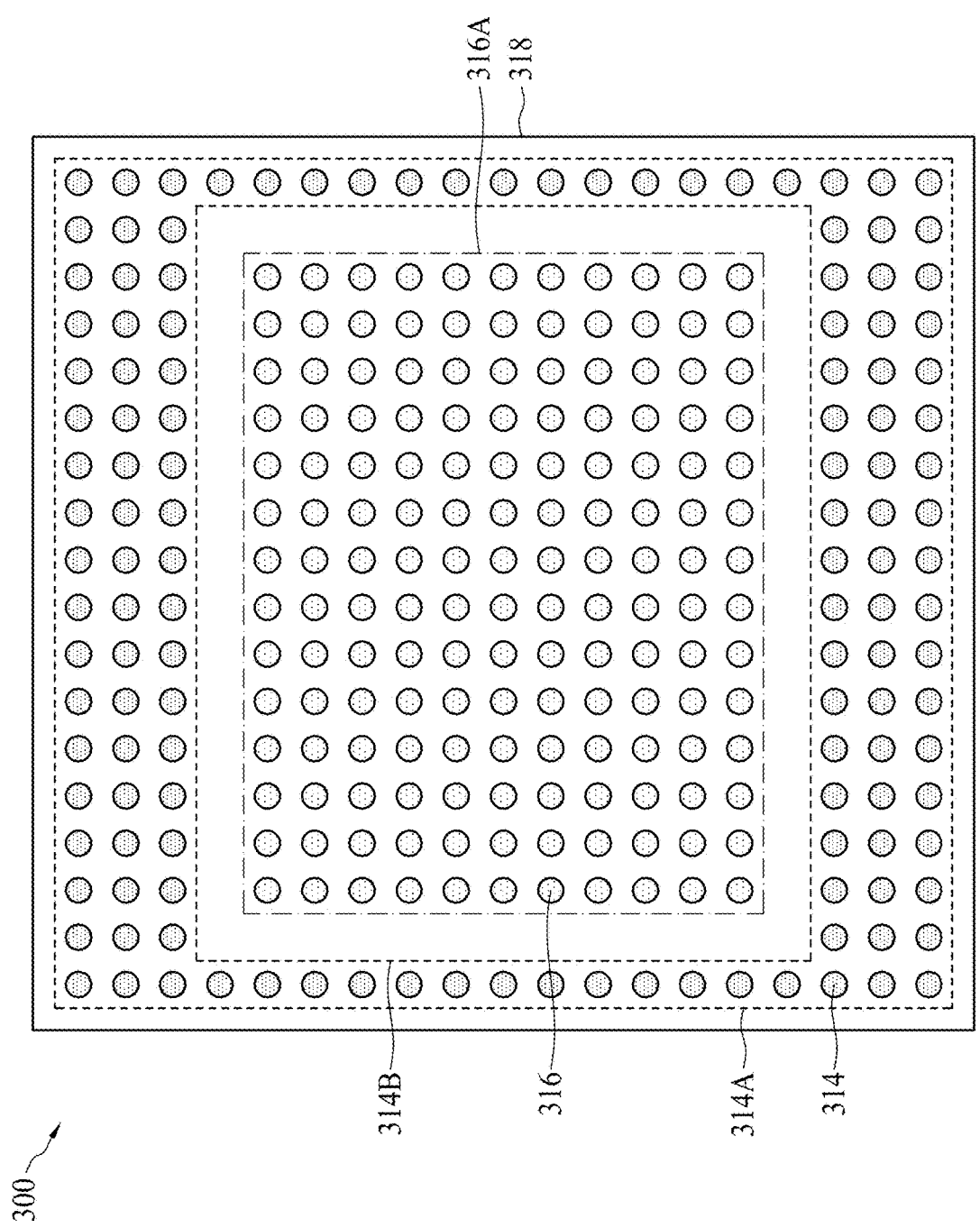
FIGS. 22, 23A, 23B, 23C, 23D, 24A, 24B, 24C, 24D, 24E, 24F, 24G, 24H, 24I, and 25 illustrate top down views of connector configurations in accordance with some embodiments.
Figure 23A:
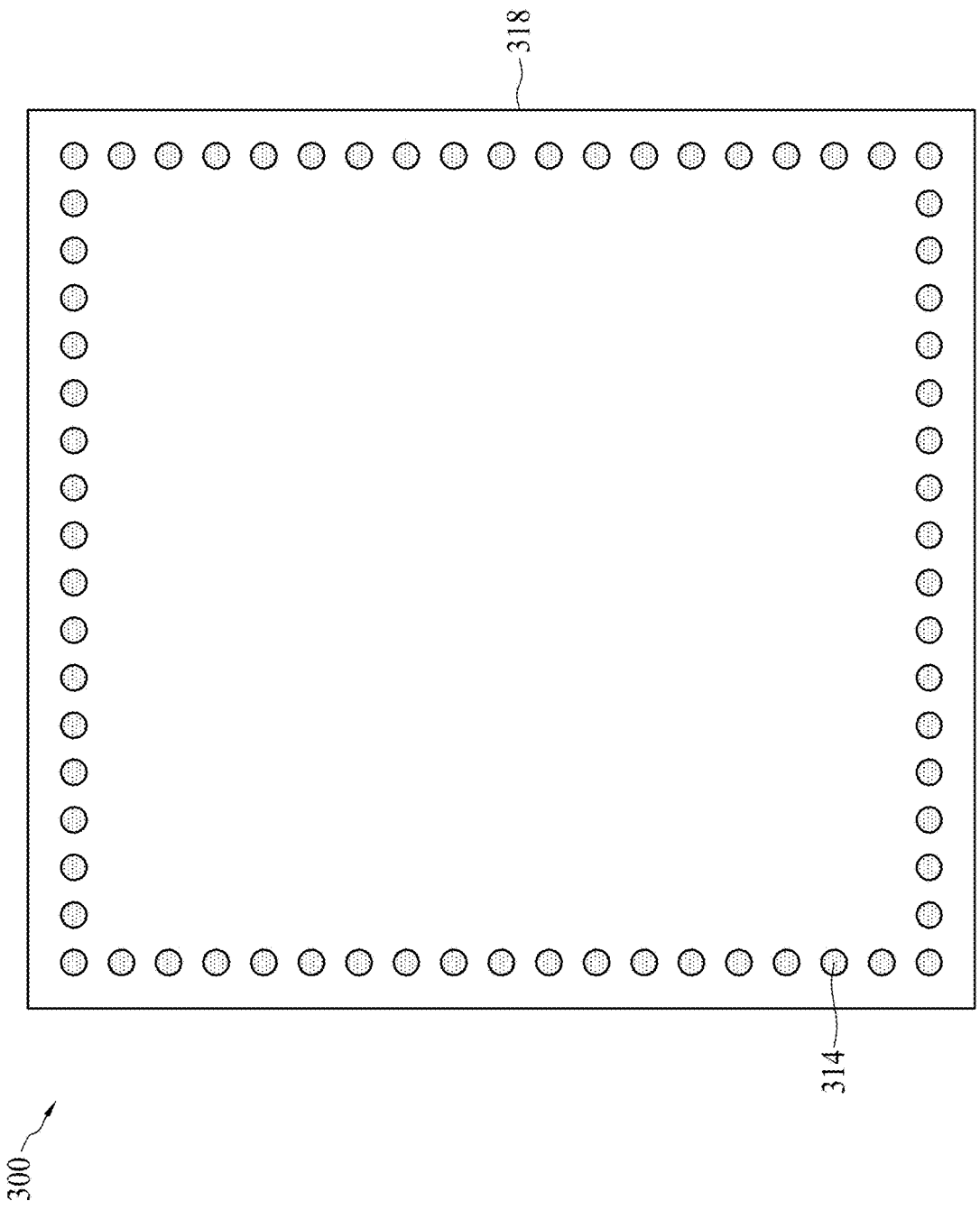
Figure 23B:
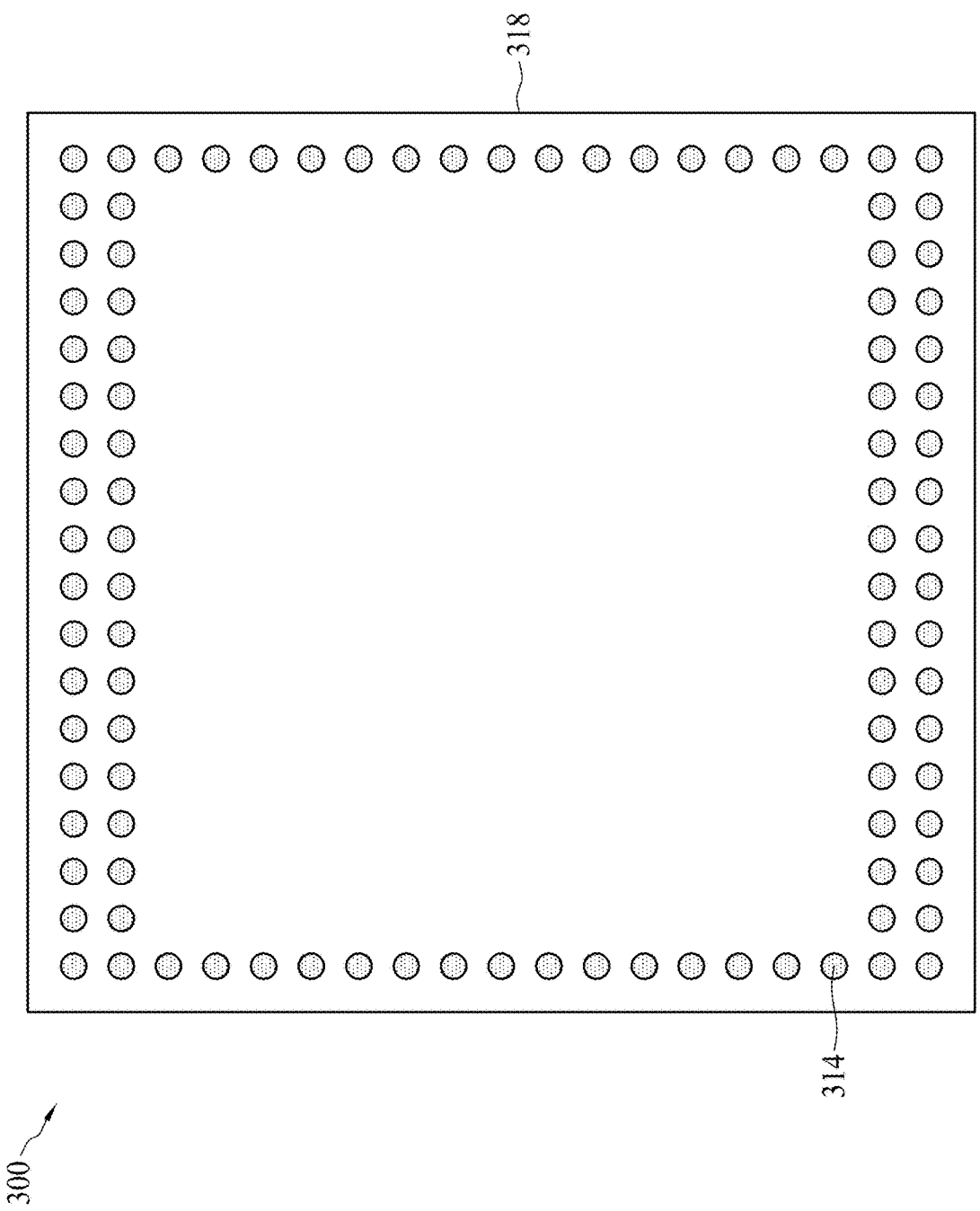
Figure 23C:
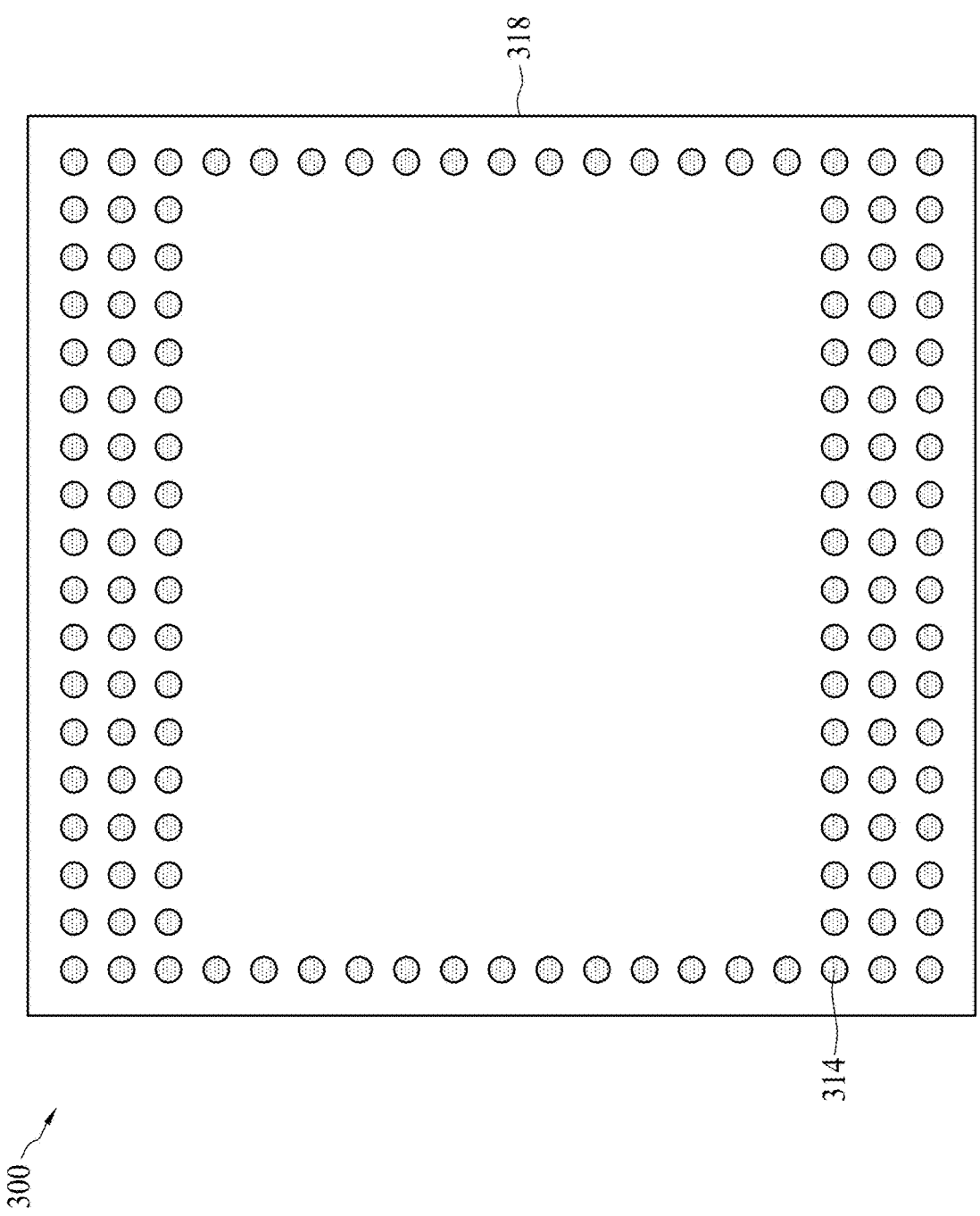
Figure 23D:
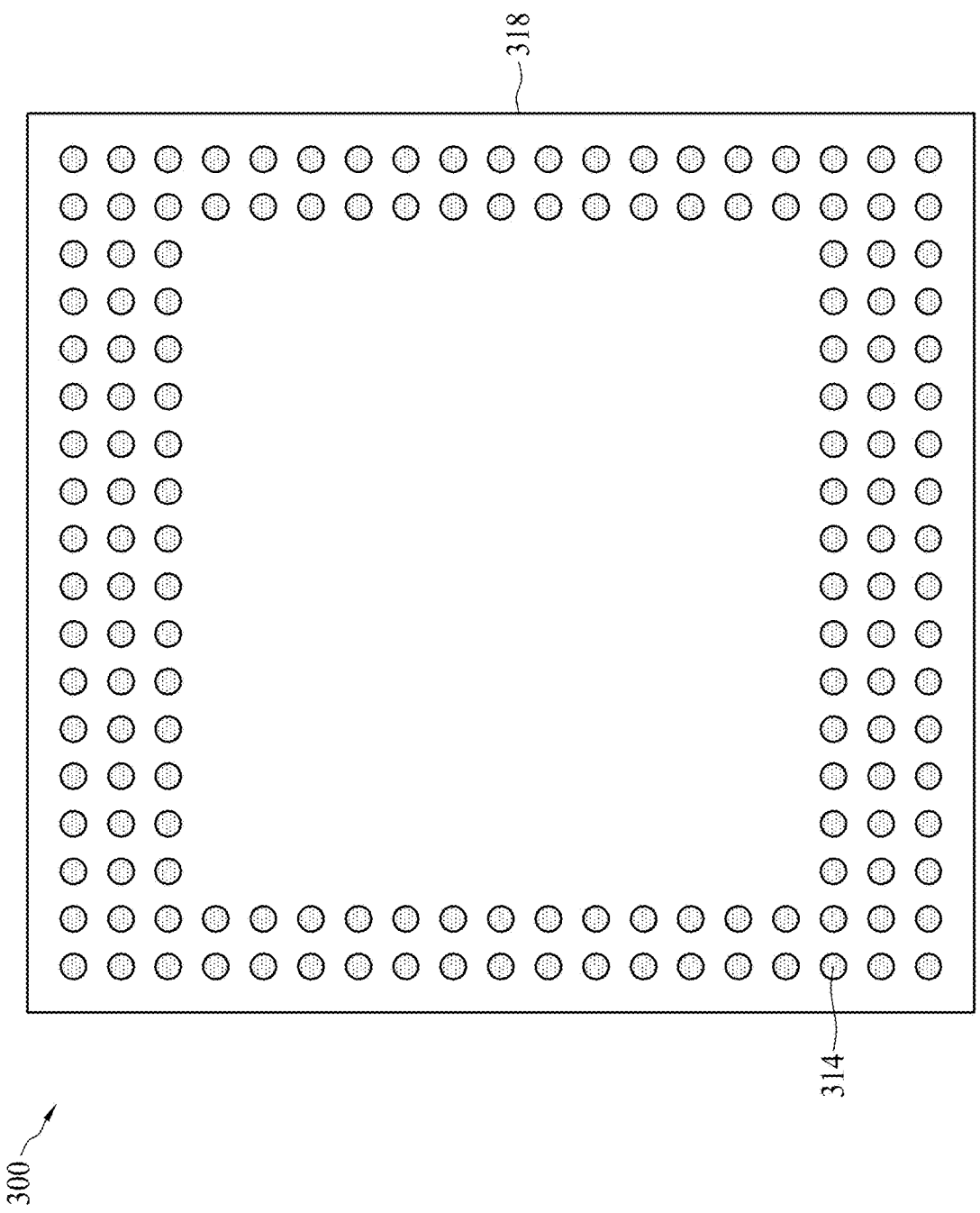

As illustrated in FIG. 21A, the functional connectors 314 are disposed at a peripheral region (e.g., around an outer edge) of the substrate 302 while the dummy connectors 316 are disposed in a central region of the substrate 302. This configuration is shown in additional detail in the top down view of the second package 300 shown in FIG. 22. In FIG. 22, the functional connectors 314 are outlined by dashed lines 314A and 314B while the dummy connectors 316 are outlined by dashed lines 316A. The functional connectors 314 may be disposed in an M×N array where 'M' designates the number of full columns of the functional connectors 314 adjacent an outer edge of the second package 300 and 'N' designates the number of full rows of the functional connectors 314 adjacent an outer edge of the second package 300. 'M' and 'N' may be any positive integer. For example, FIGS. 23A through 23D illustrate top down views of different configurations of the functional connectors 314. In FIGS. 23A through 23D, the dummy connectors 316 are omitted for simplicity. FIG. 23A illustrates the functional connectors 314 in a 1×1 array configuration, FIG. 23B illustrates the functional connectors 314 in a 1×2 array configuration, FIG. 23C illustrates the functional connectors 314 in a 1×3 array configuration, and FIG. 23D illustrates the functional connectors 314 in a 2×3 array configuration. The configurations in FIGS. 23A through 23D are purely exemplary and other configurations (e.g., having a different number columns and/or rows) of the functional connectors 314 are possible.

Referring back to FIG. 22, the functional connectors 314 may encircle the dummy connectors 316 in a top down view. The dummy connectors 316 can be arranged in any suitable configuration. For example, FIG. 24A through 24I illustrate some example configurations of the dummy connectors 316. Similar to FIG. 22, in FIGS. 24A through 24I, the functional connectors 314 are outlined by dashed lines 314A and 314B while the dummy connectors 316 are outlined by dashed lines 316A. Although FIGS. 24A through 24I illustrate the dummy connectors 316 in combination with a 1×3 array configuration of the functional connectors 314, it should be appreciated that the dummy connectors 316 can be combined with any configuration of the functional connectors 314 (e.g., an array having a different number of columns and/or rows).

Figure 24A:
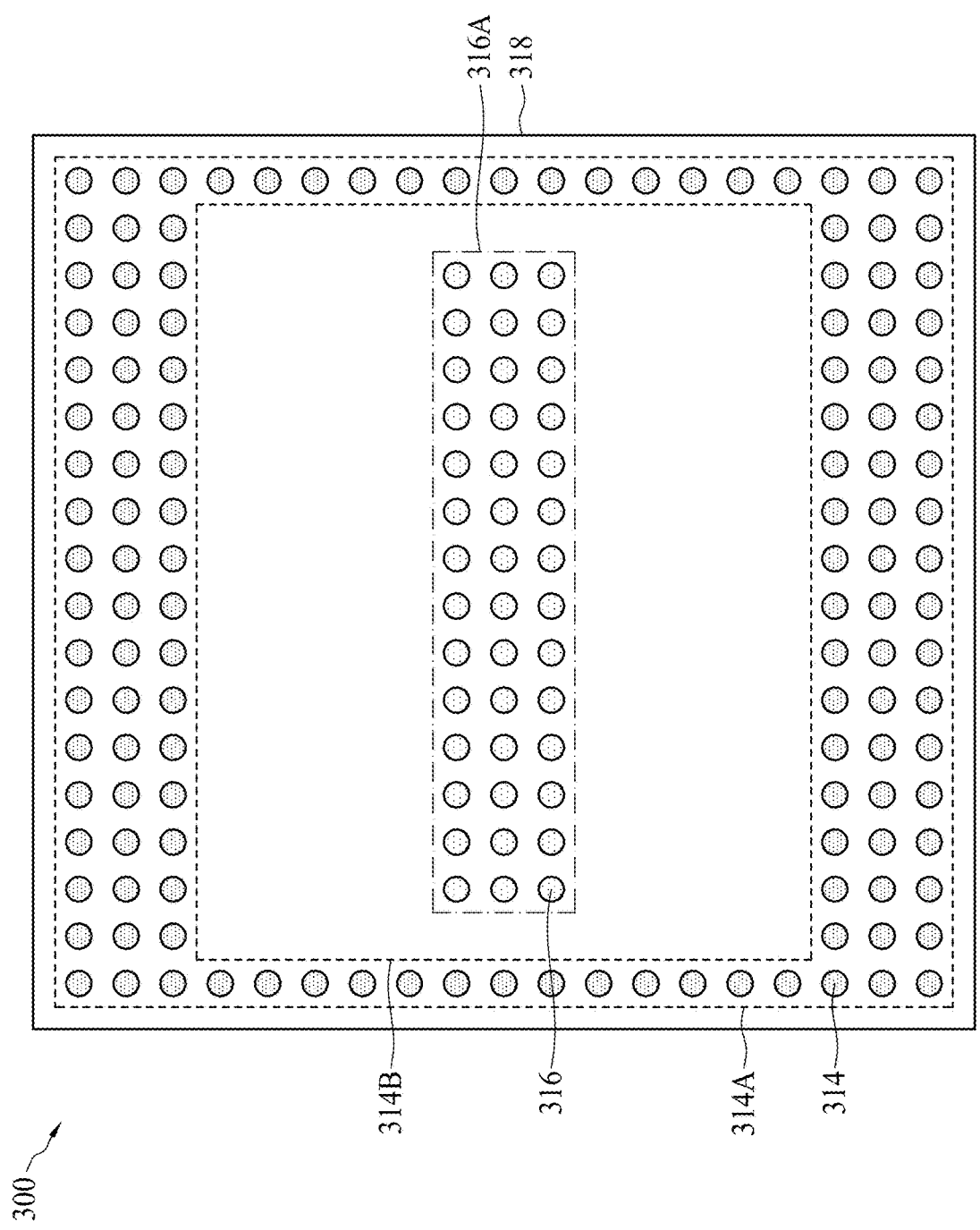
Figure 24B:
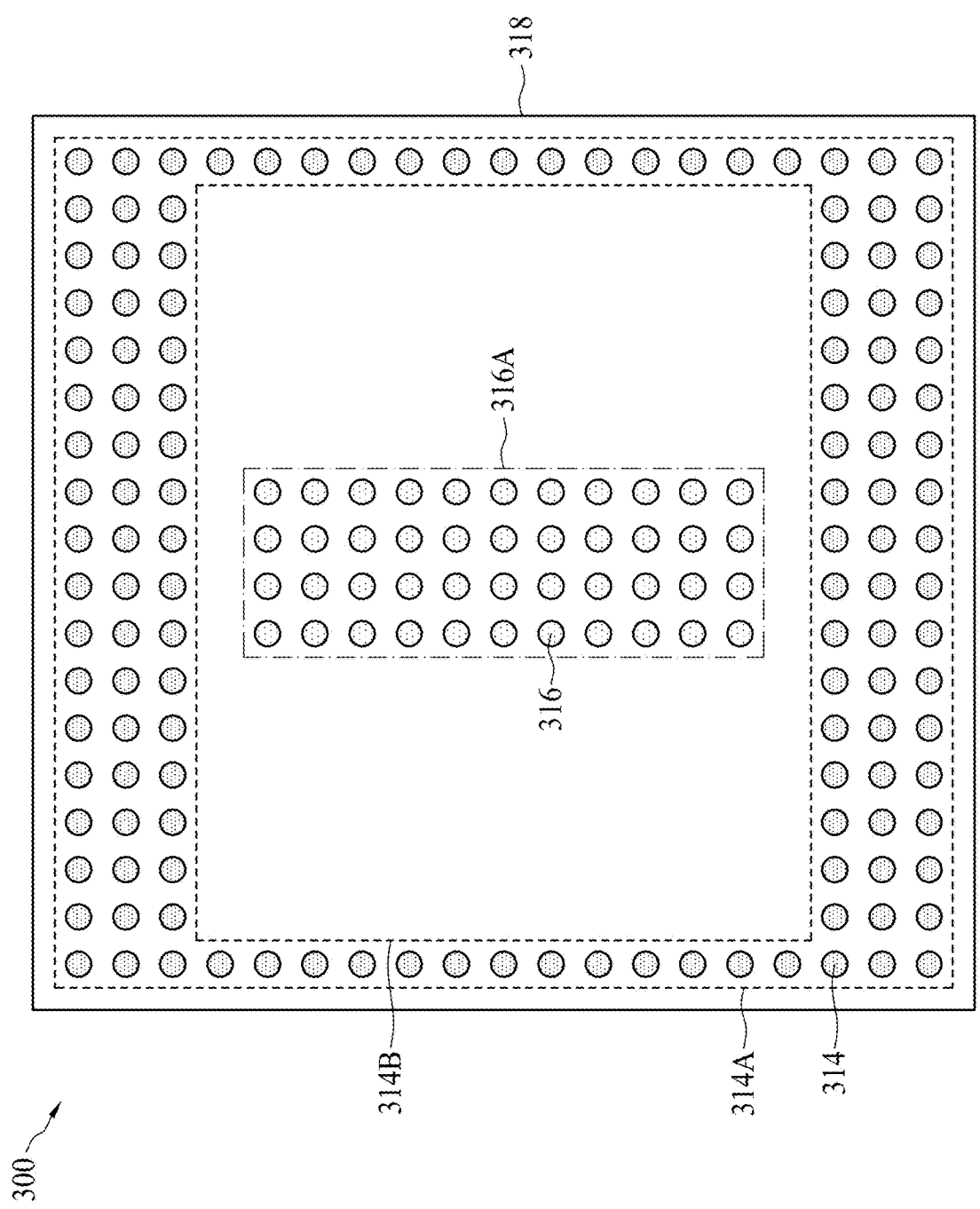

In some embodiments, the dummy connectors 316 may be disposed in an array comprising a plurality of rows and columns. For example, dummy connectors 316 may be disposed in an R×S array where 'R' is the number of columns and 'S' is the number of rows of dummy connectors 316 in the array. In various embodiments, 'R' and 'S' may be any positive integer, and R may be greater than S (e.g., as illustrated in FIG. 24A), equal to S (not explicitly illustrated), or less than S (e.g., as illustrated by FIG. 24B).

Figure 24C:
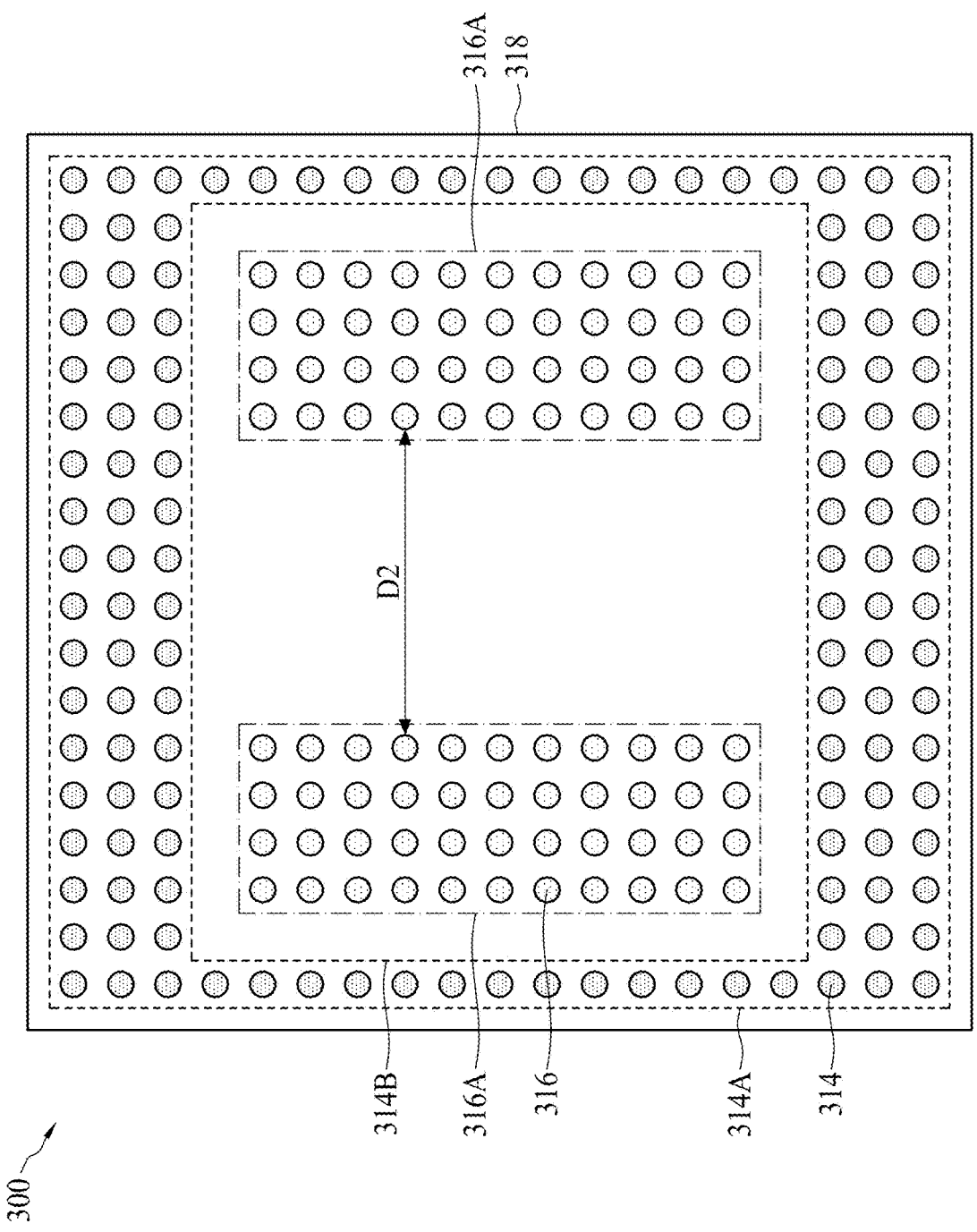
Figure 24D:
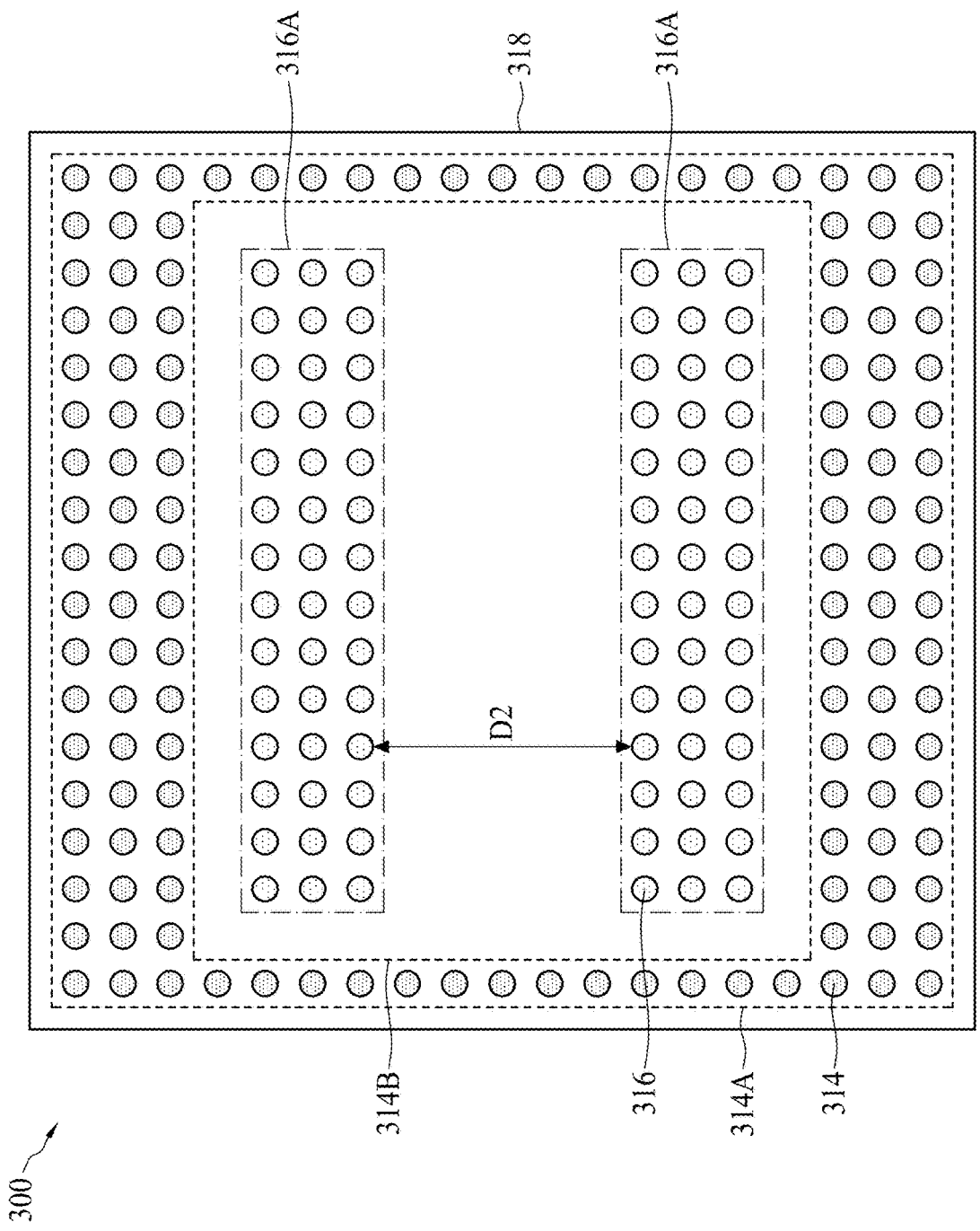

In some embodiments, the functional connectors 314 may encircle a plurality of arrays of the dummy connectors 316. For example, as illustrated by FIGS. 24C and 24D, the functional connectors 314 may encircle two arrays of the dummy connectors 316. Each array of the dummy connectors 316 may include R×S dummy connectors 316, and R may be greater than S (e.g., as illustrated by FIG. 24C), equal to S (not explicitly illustrated), or less than S (e.g., as illustrated by FIG. 24D). As illustrated by FIGS. 24C and 24D, distance D2 between two nearest dummy connectors 316 in two different arrays may be greater than a pitch between adjacent dummy connectors 316 in a same array.

Figure 24E:
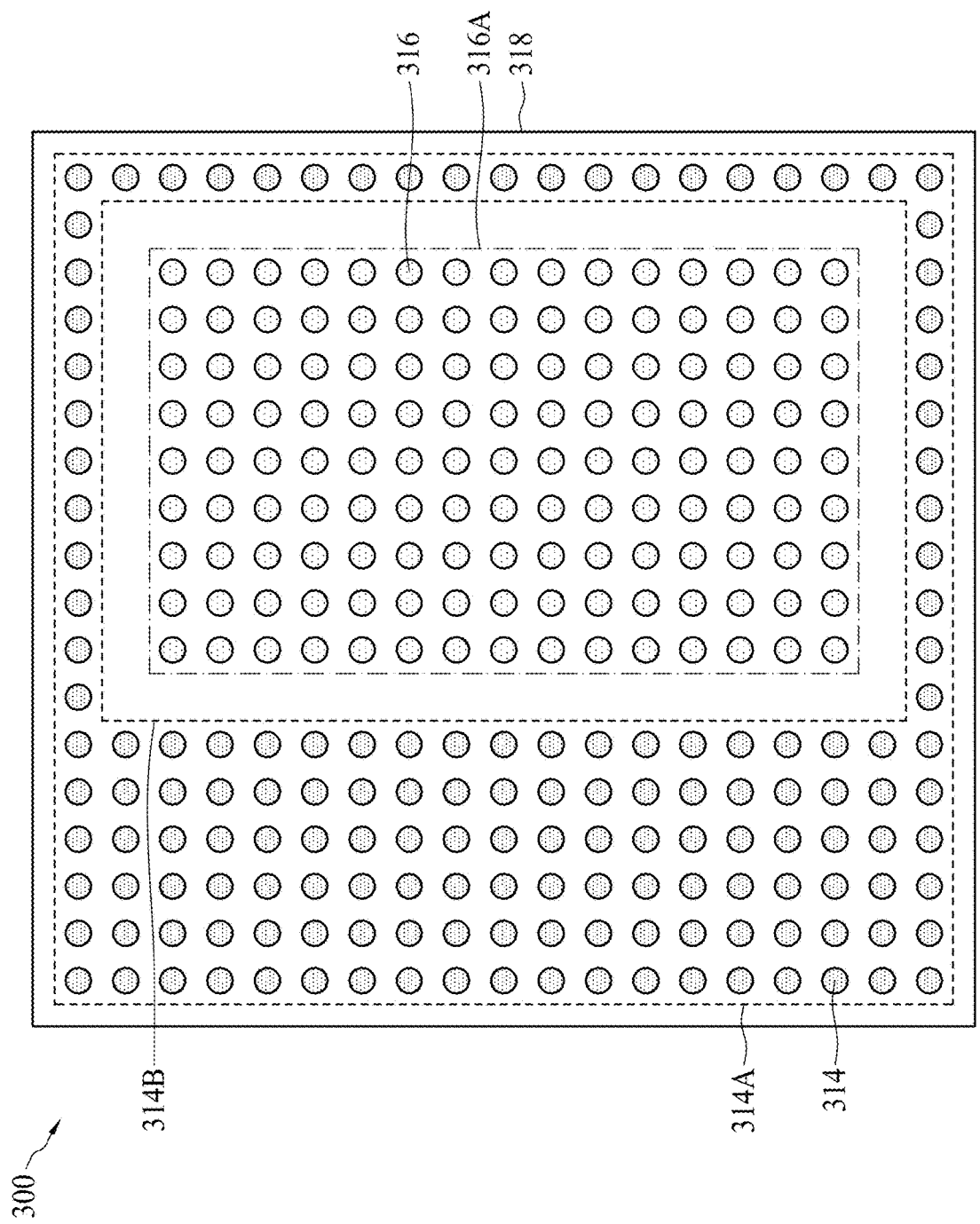
Figure 24F:
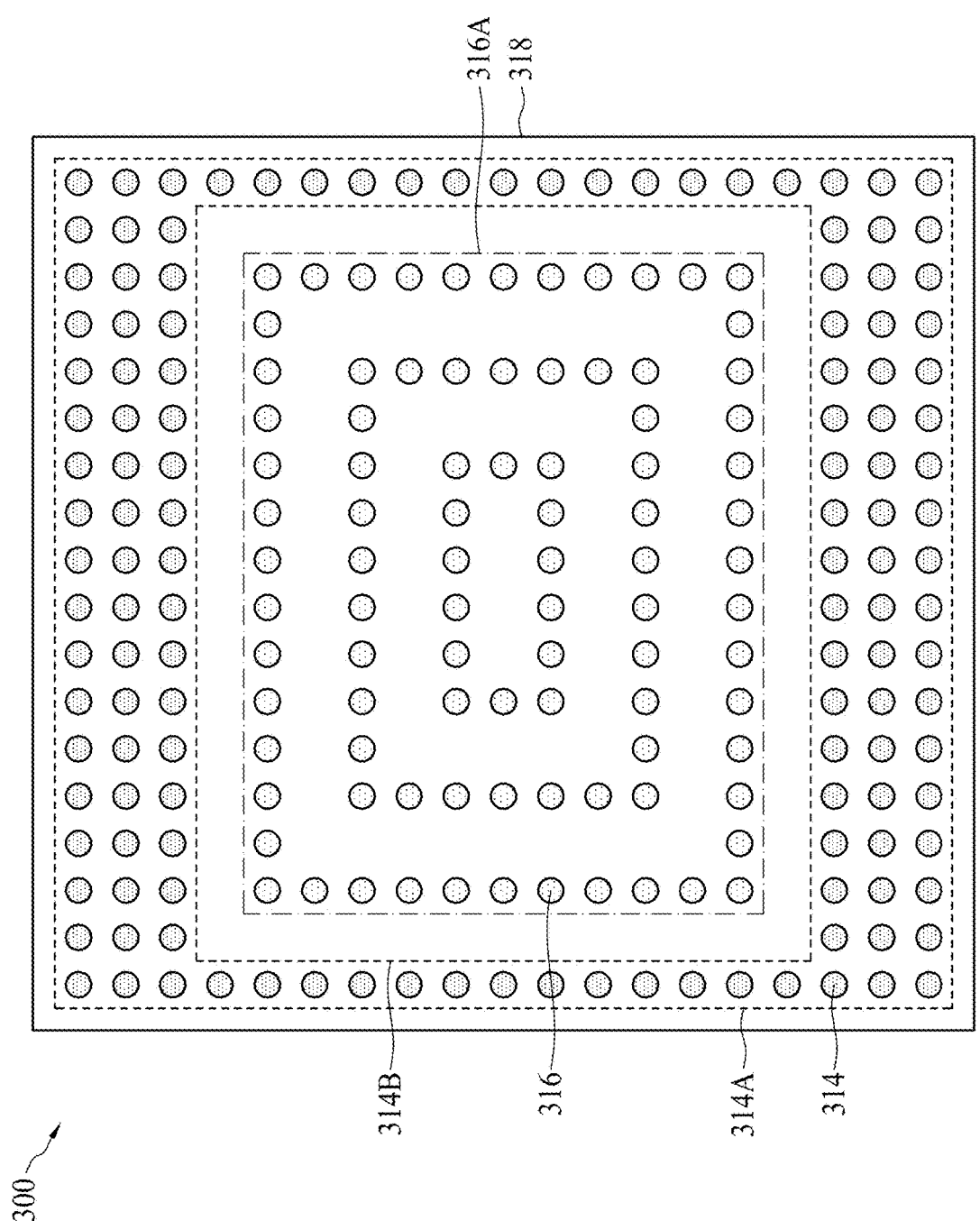
Figure 24G:
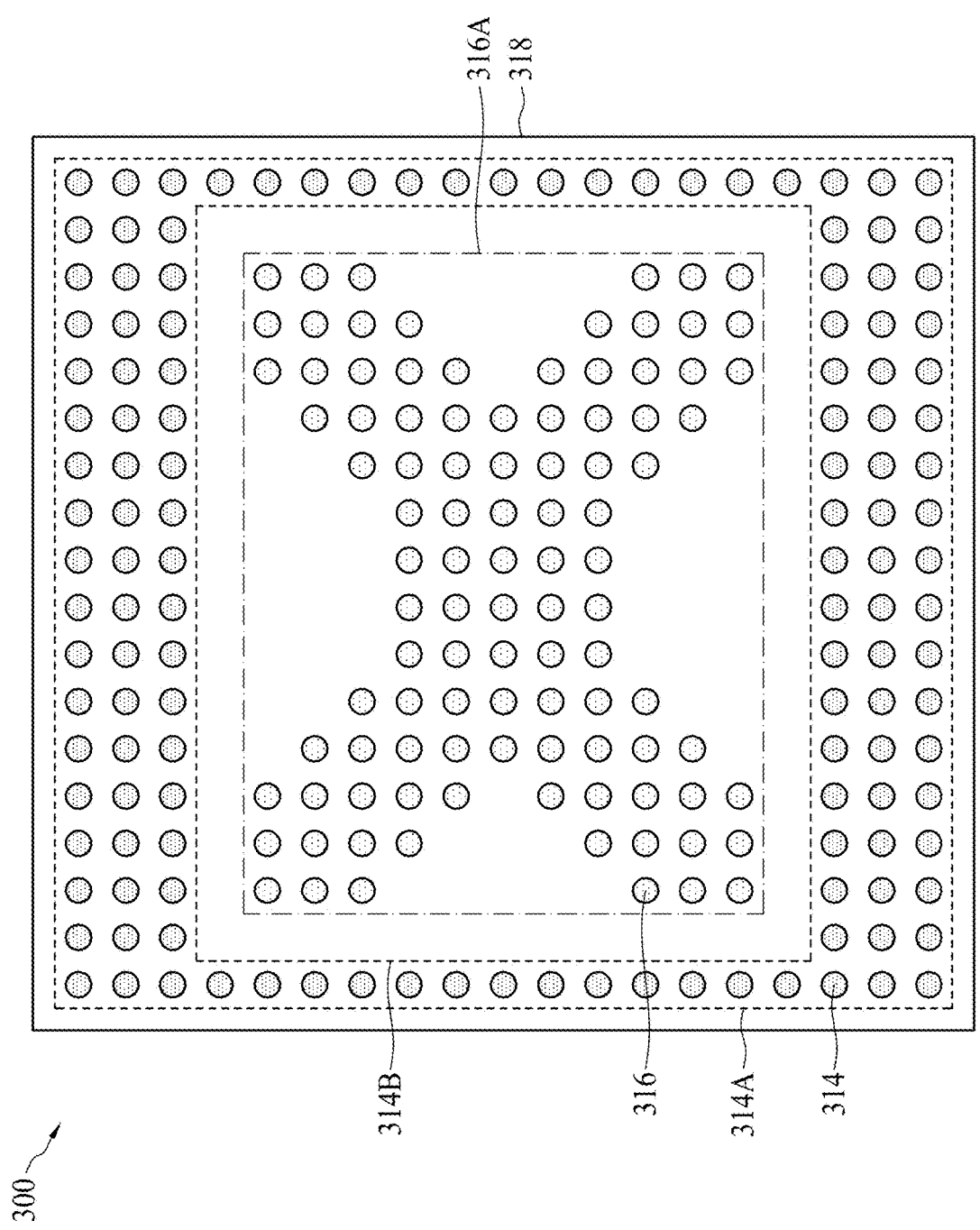
Figure 24H:
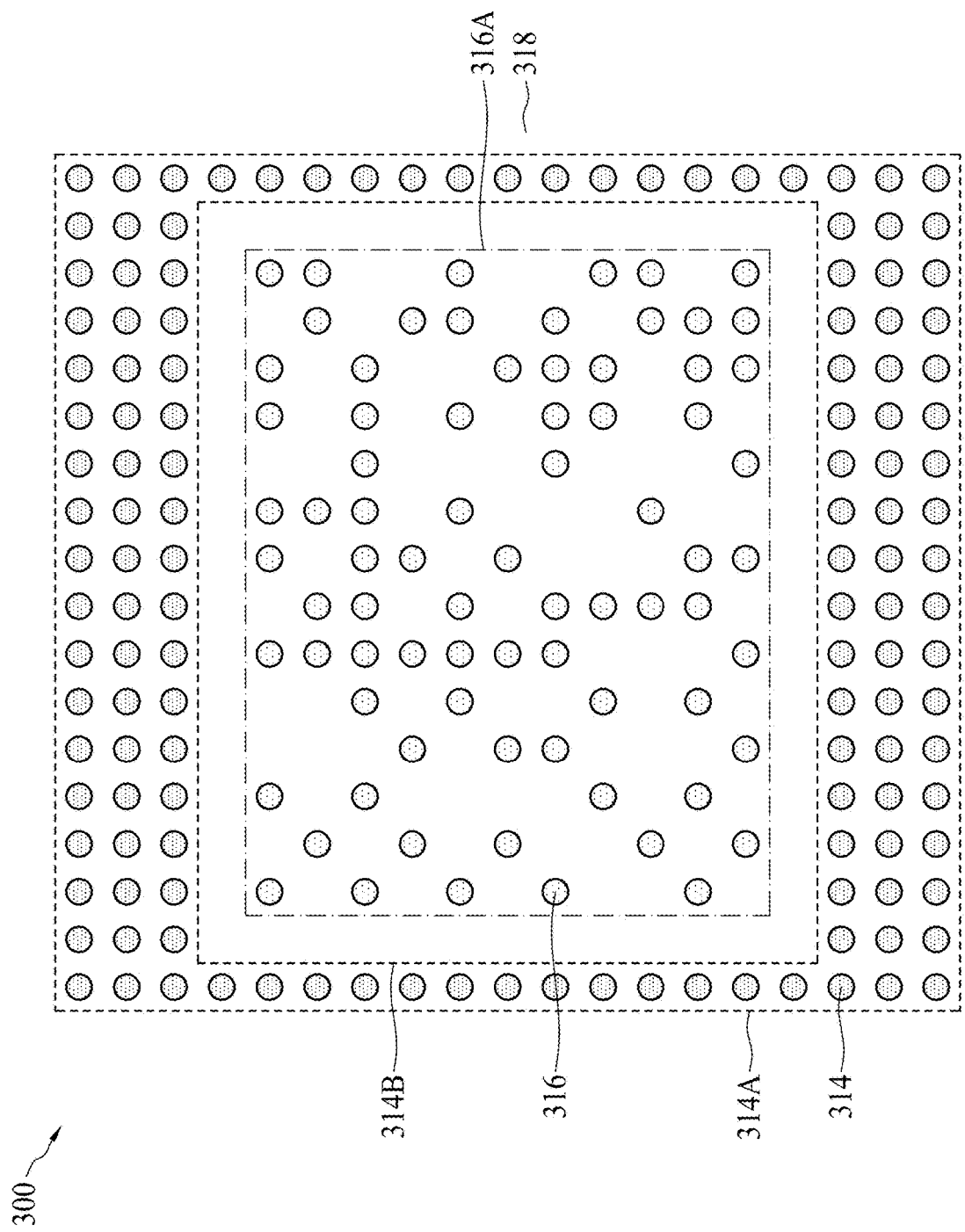

In some embodiments, the dummy connectors 316 may be disposed in a pattern (e.g., an array), which is centered relative an outer perimeter of the second package 300 in a top down view (e.g., as illustrated in FIG. 22). In other embodiments, the dummy connectors 316 may be disposed in a pattern (e.g., an array), which is offset from a center of the second package 300 in a top down view (see FIG. 24E). In such embodiments when the pattern of the dummy connectors 316 are not centered, a different number of the functional connectors 314 may be disposed on opposing sides of the pattern of the dummy connectors 316. For example, as illustrated in FIG. 24E, a greater number of the functional connectors 314 are disposed on the left side of the array of the dummy connectors 316 as the right of the array of the dummy connectors 316. In other embodiments, an equal number of the functional connectors 314 may be disposed on opposing sides of the dummy connectors 316.

As described in FIGS. 22 and 24A through 24E, the dummy connectors 316 are disposed in an array of rows and columns. In other embodiments, the dummy connectors 316 may be disposed in a different pattern. For example, the dummy connectors 316 may be disposed in a pattern of concentric rings where an outer ring of the dummy connectors 316 encircles one or more inner rings of the dummy connectors 316 (e.g., see FIG. 24F). As another example, the dummy connectors 316 may be disposed in an X-pattern (e.g., see FIG. 24G). As yet another example, the dummy connectors 316 may be disposed in a random distribution (e.g., see FIG. 24H). Other patterns of the dummy connectors 316 are also possible.

Figure 24I:
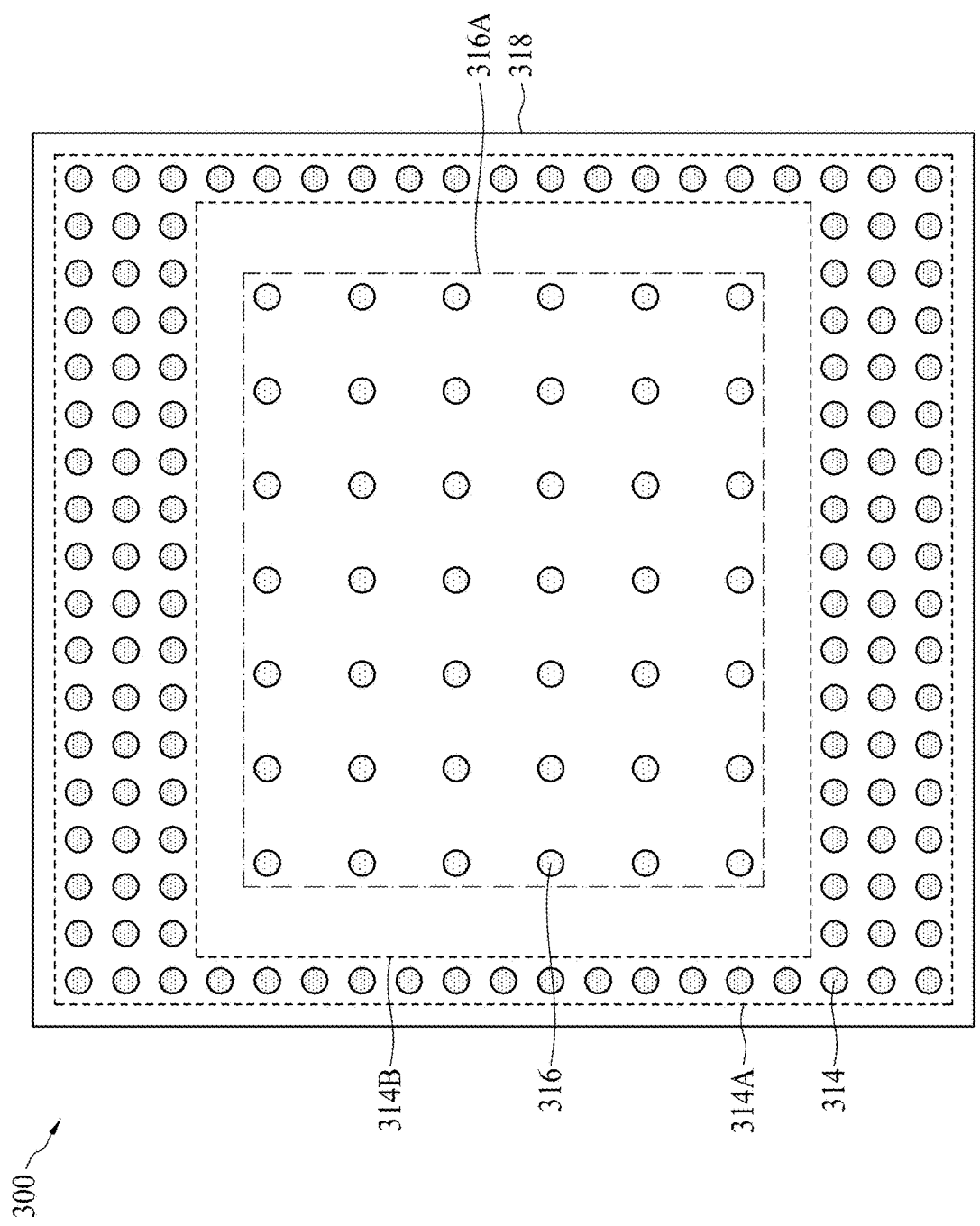

Furthermore, in some embodiments, a pitch between adjacent ones of the dummy connectors 316 may be the same as a pitch between adjacent ones of the functional connectors 314 (see FIG. 22). In other embodiments, a pitch between adjacent ones of the dummy connectors 316 may different than a pitch between adjacent ones of the functional connectors 314. For example, the pitch between adjacent ones of the dummy connectors 316 may be a multiple of the pitch between adjacent ones of the functional connectors 314. FIG. 24I illustrates an example embodiment where a pitch between adjacent ones of the dummy connectors 316 is double a pitch between adjacent ones of the functional connectors 314. The example pitches discussed herein may be used in combination with any pattern of the dummy connectors 316 (e.g., as described above with respect to FIGS. 22 and 24A through 24H).

Figure 25:
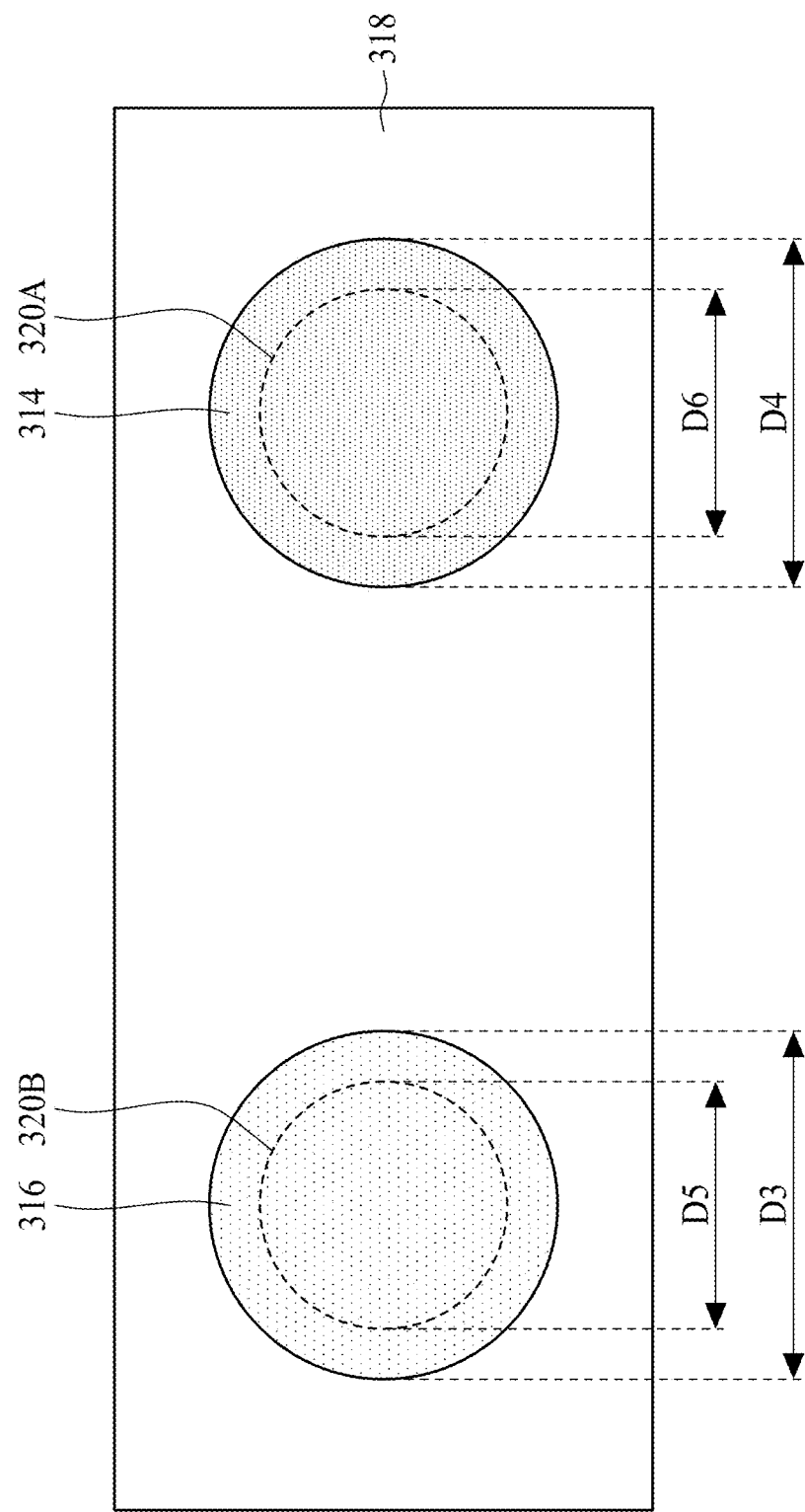

FIG. 25 illustrates a top down view of a dummy connector 316 and a functional connector 314, which may be disposed in any of the configurations described above. A diameter of the dummy connector 316 is designated as D3, and a diameter of the functional connector 314 is designated as D4. In some embodiments, the diameter D3 of the dummy connectors 316 may be less than or equal to the diameter D4 of the functional connectors 314. For example, in an embodiment where the diameter D4 of the functional connectors 314 is about 210 µm, the diameter D3 of the dummy connectors 316 may be about 210 µm or less. Furthermore, the functional connectors 314 and the dummy connectors 316 may each be disposed in a solder resist opening (SRO) extending through the solder resist 318. In FIG. 25, an outline of SRO 320A underlying the functional connector 314 and an outline of SRO 320B underlying the dummy connector 316 are shown in ghost. A diameter of the SRO 320B underlying the dummy connector 316 is designated as D5, and a diameter of SRO 320A underlying the functional connector 314 is designated as D6. In some embodiments, the diameter D5 of the SRO's 320B underlying the dummy connectors 316 may be greater than or equal to the diameter D6 of the SRO's 320A underlying the functional connectors 314. For example, in an embodiment where the diameter D6 of the SRO's 320A underlying functional connectors 314 is about 190 µm, the diameter D5 of the SRO's 320B underlying the dummy connectors 316 may be about 190 µm or greater. Other diameters for the functional connector 314, the dummy connector 316, the SRO 320A, and/or the SRO 320B are also contemplated.

Figure 26:
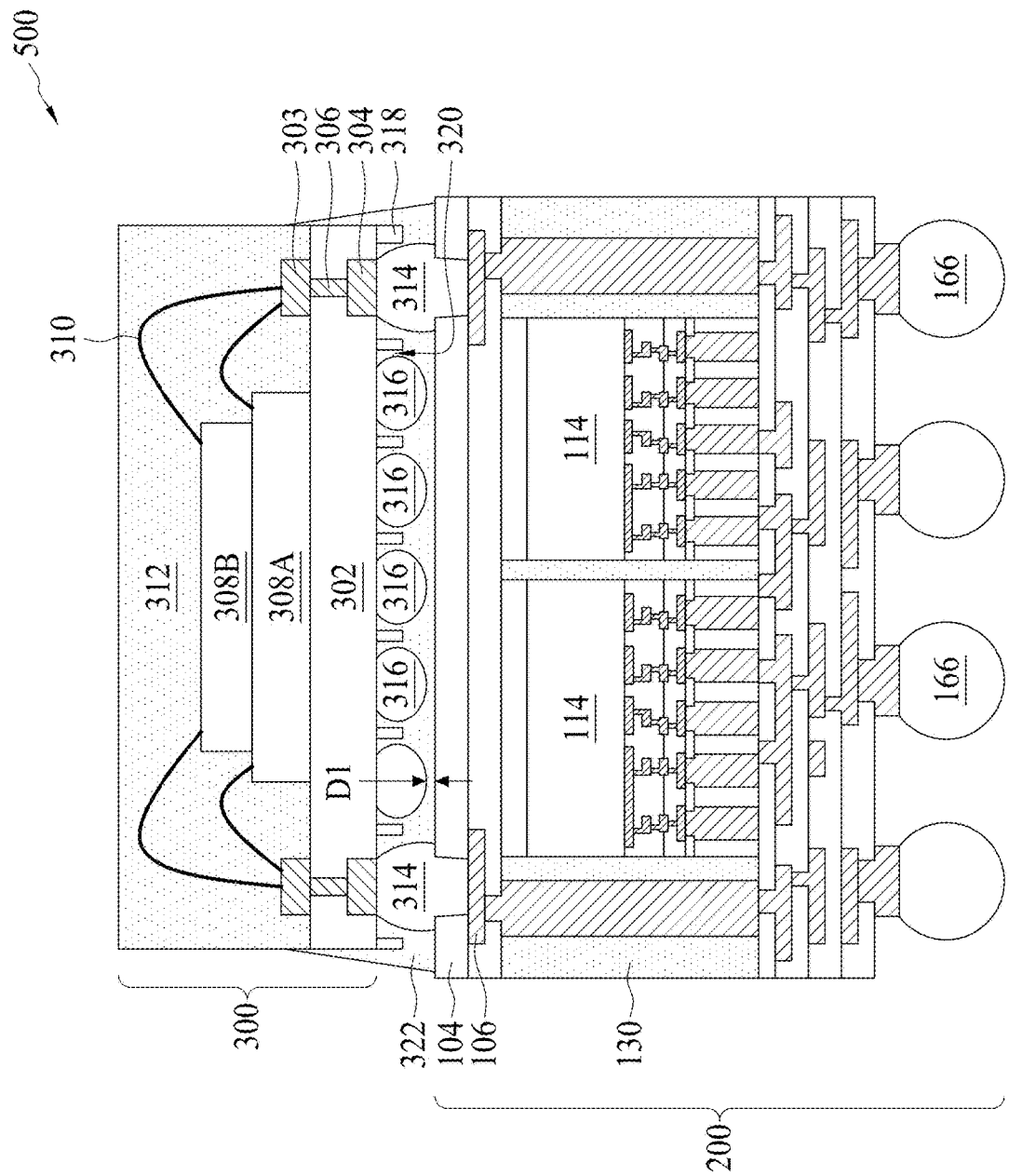
FIG. 26 illustrates a cross-sectional view of an intermediate step during a process for dispensing an underfill in accordance with some embodiments.

Referring next to FIG. 26, an underfill 322 may be formed between the second package 300 and the first package 200 and surrounding the functional connectors 314 and the dummy connectors 316. In some embodiments, the underfill 322 may further extend along sidewalls of the second package 300 (e.g., along sidewalls of the substrate 302 and the molding material 312. The underfill 322 may be formed by a capillary flow process after the second package 300 is attached or may be formed by a suitable deposition method before the second package 300 is attached. In various embodiments, the underfill 322 may flow under the dummy connectors 316 and span a distance between the dummy connectors 316 and the first package 200. For example, the underfill 322 may be disposed between the dummy connectors 316 and the first package 200 along a line perpendicular to a major surface of the substrate 302.

Due to imperfections in the manufacturing process, warpage may occur in the second package 300. For example, the second package 300 may have a "smiling" or "crying" profile in a cross sectional view (not explicitly illustrated). In an embodiment smiling profile (not explicitly illustrated), peripheral areas of the second package 300 may be disposed farther from the first package 200 than central areas of the second package 300. In an embodiment crying profile (not explicitly illustrated), peripheral areas of the second package 300 may be disposed closer to the first package 200 than central areas of the second package 300. It has been observed that such warpage characteristics may result in an undesirable wave front (sometimes referred to as a leading edge) of the underfill 322 during dispensation, which may result in undesired voids trapped in the underfill 322 between the first package 200 and the third package 300. Such voids may further cause manufacturing defects, such as popcorning effects (where the first package 200 and the second package 300 buckle away from each other) after reliability tests and negatively affected.

In various embodiments, the dummy connectors 316 may be included in order to control a profile of the wave front of the underfill 322 during dispensation. It has been observed that be including the dummy connectors 316 on a same surface of the second package 300 as the functional connectors 314, underfill dispensation wave fronts can be improved for both crying and smiling profiles of the second package 300.

For example, FIGS. 27A through 27C illustrate simulation data for underfill dispensation in embodiment packages where the second package 300 (see FIG. 26) has a smiling profile. In order to simulate a smiling profile, −50 µm was set as a value of a distance between the first package 200 and the second package 300 at a center of the package minus a distance between the first package 200 and the second package 300 at an edge of the package. FIGS. 27A through 27C illustrate top down views of the second package 300 and the flow of underfill 322 under the second package 300. FIG. 27A illustrates wave front 500A of the underfill 322 when the dummy connectors 316 are not included in the second package 300. FIGS. 27B and 27C illustrate wave fronts 500B and 500C, respectively, of the underfill 322 when the dummy connectors 316 are included in the second package 300. FIG. 27B illustrates an embodiment where a material of the underfill 322 contacts the functional connectors 314 at an angle of 15°, and FIG. 27C illustrates an embodiment where a material of the underfill 322 contacts the functional connectors 314 at an angle of 60°. Referring to FIG. 27A, a distance between a center 502 of the wave front 500A and an edge 504 of the wave front 500A is relatively large. In a smiling-profile warped package, this relatively large distance in the wave front 500A may cause voids 506/508 to form. It has been observed by including the dummy connectors 316, a distance between respective centers 502 of the wave fronts 500B/500C and respective edges 504 of the wave fronts 500B/500C can be reduced compared to packages without the dummy connectors 316. For example, a distance between center 502 and edge 504 may be reduced by about 50% in wave fronts 500B and 500C compared to wave front 500A. It has further been observed that by decreasing this distance (i.e., between points 502 and 504) in a smiling-profile warped package, the size and/or quantity of voids in the underfill 322 can be advantageously reduced.

Figure 28C:
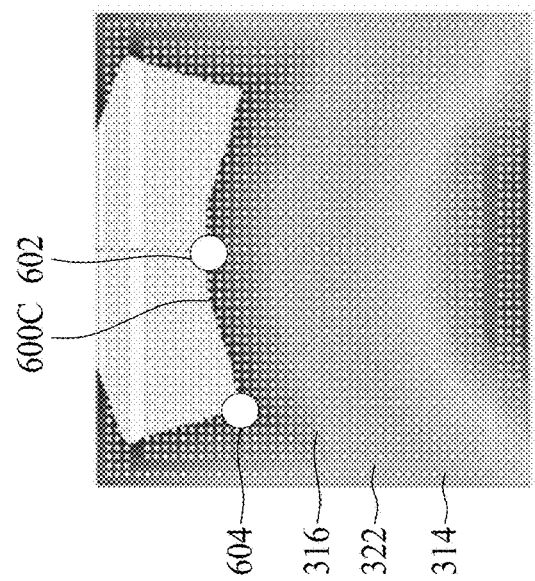
Figure 28B:
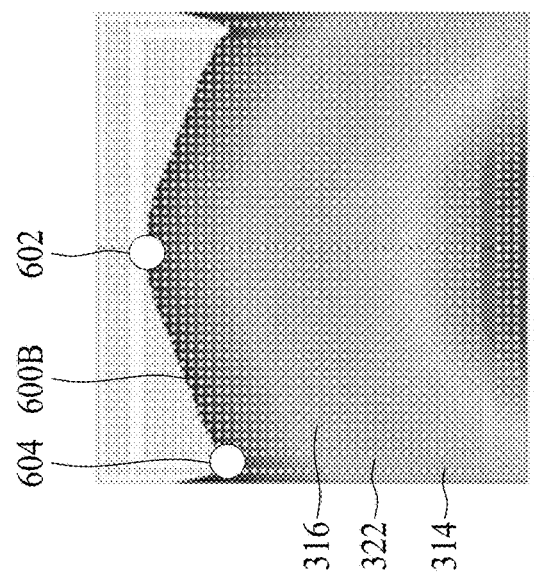
Figure 28A:
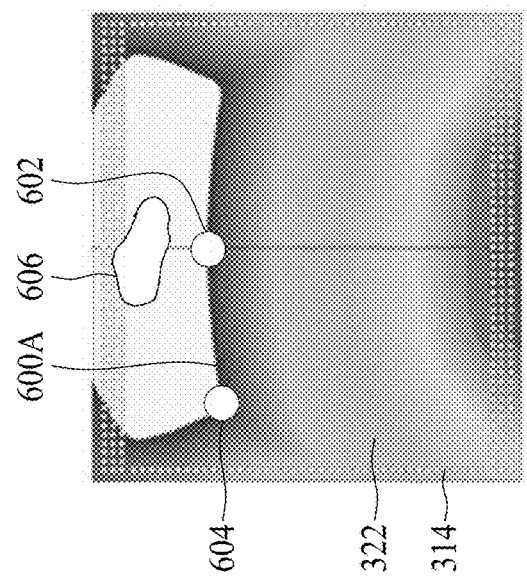

As another example, FIGS. 28A through 28C illustrate simulation data for underfill dispensation in embodiment packages where the second package 300 (see FIG. 26) has a crying profile. In order to simulate a crying profile, 20 µm was set as a value of a distance between the first package 200 and the second package 300 at a center of the package minus a distance between the first package 200 and the second package 300 at an edge of the package. FIGS. 28A through 28C illustrate top down views of the second package 300 and the flow of underfill 322 under the second package 300. FIG. 28A illustrates wave front 600A of the underfill 322 when the dummy connectors 316 are not included in the second package 300. FIGS. 28B and 28C illustrate wave fronts 600B and 600C, respectively, of the underfill 322 when the dummy connectors 316 are included in the second package 300. FIG. 28B illustrates an embodiment where a material of the underfill 322 contacts the functional connectors 314 at an angle of 15°, and FIG. 28C illustrates an embodiment where a material of the underfill 322 contacts the functional connectors 314 at an angle of 60°. Referring to FIG. 28A, a distance between a center 602 of the wave front 600A and an edge 604 of the wave front 600A is relatively small. In a crying-profile warped package, this relatively small distance in the wave front 600A may cause one or more voids 606 to form. It has been observed by including the dummy connectors 316, a distance between respective centers 602 of the wave fronts 600B/600C and respective edges 604 of the wave fronts 600B/600C can be increased compared to packages without the dummy connectors 316. For example, a distance between center 602 and edge 604 may be increased by about 230%, 500%, or more in wave fronts 600B and 600C compared to wave front 600A. It has further been observed that by increasing this distance (i.e., between points 602 and 604) in a crying-profile warped package, the size and/or quantity of voids in the underfill 322 can be advantageously reduced.

Figure 29:
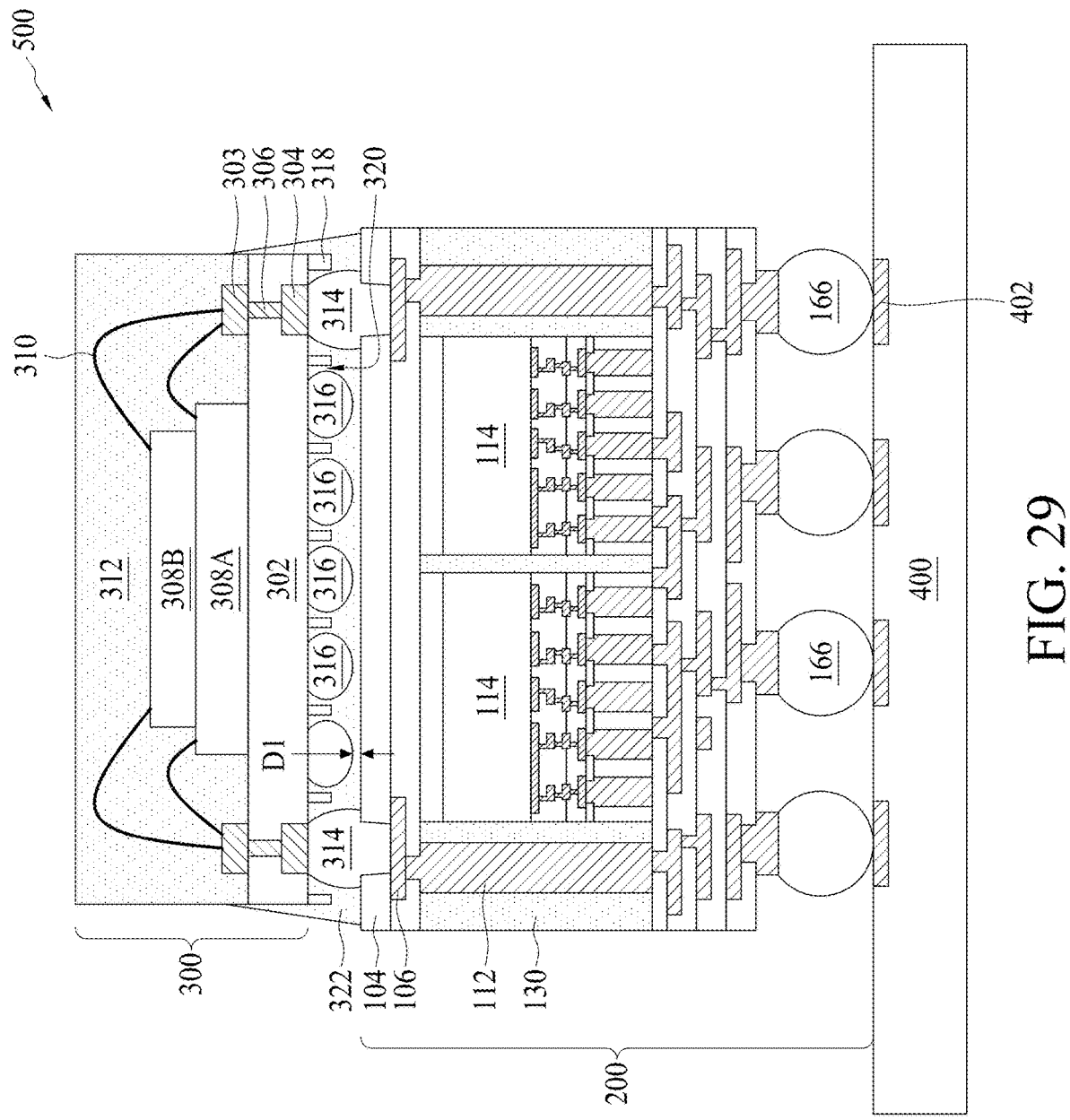
FIG. 29 illustrates a cross-sectional view of an intermediate step during a process for attaching other package structures to the first package in accordance with some embodiments.

FIG. 29 illustrates the semiconductor package 500 after the packages 200 and 300 being mounted to a substrate 400. The substrate 400 may be referred to a package substrate 400. The package 200 is mounted to the package substrate 400 using the conductive connectors 166.

The package substrate 400 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 400 may be a SOI substrate. Generally, an SOI substrate includes a layer of a semiconductor material such as epitaxial silicon, germanium, silicon germanium, SOI, SGOI, or combinations thereof. The package substrate 400 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for package substrate 400.

The package substrate 400 may include active and passive devices (not shown in FIG. 29). As one of ordinary skill in the art will recognize, a wide variety of devices such as transistors, capacitors, resistors, combinations of these, and the like may be used to generate the structural and functional requirements of the design for the semiconductor package 500. The devices may be formed using any suitable methods.

The package substrate 400 may also include metallization layers and vias (not shown) and bond pads 402 over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 400 is substantially free of active and passive devices.

In some embodiments, the conductive connectors 166 can be reflowed to attach the package 200 to the bond pads 402. The conductive connectors 166 electrically and/or physically couple the substrate 400, including metallization layers in the substrate 400, to the first package 200. In some embodiments, passive devices (e.g., surface mount devices (SMDs), not illustrated) may be attached to the package 200 (e.g., bonded to the bond pads 402) prior to mounting on the substrate 400. In such embodiments, the passive devices may be bonded to a same surface of the package 200 as the conductive connectors 166.

The conductive connectors 166 may have an epoxy flux (not shown) formed thereon before they are reflowed with at least some of the epoxy portion of the epoxy flux remaining after the package 200 is attached to the substrate 400. This remaining epoxy portion may act as an underfill to reduce stress and protect the joints resulting from the reflowing the conductive connectors 166. In some embodiments, an underfill (not shown) may be formed between the first package 200 and the substrate 400 and surrounding the conductive connectors 166. The underfill may be formed by a capillary flow process after the package 200 is attached or may be formed by a suitable deposition method before the package 200 is attached.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments of the device and methods in the current disclosure have many advantages. In particular, dummy connectors are disposed between a first package and a second package of a PoP structure. The dummy connectors may be disposed on a same surface of the second package as functional connectors electrically and mechanically bonding the first and second packages. In some embodiments, the dummy connectors may be physically and/or electrically disconnected from the first package. The dummy connectors may be used to improve a profile of a wave front of an underfill dispensed between the first package and the second package. By improving the wave front profile of the underfill, the underfill may trap fewer and/or smaller voids, thereby improving reliability and reduce defects (e.g., popcorning) both prior to and after package reliability testing.

In accordance with an embodiment, a package includes a first package. The first package includes a first integrated circuit die, an encapsulant around the first integrated circuit die, and redistribution layers over the encapsulant and the first integrated circuit die. The package also includes a second package bonded to the first package by a plurality of functional connectors. The functional connectors and the redistribution layers electrically connect a second integrated circuit die of the second package to the first integrated circuit die. The package also includes a plurality of dummy connectors disposed between the first package and the second package. One end of each of the plurality of dummy connectors facing the first package is physically separated from the first package.

In accordance with an embodiment, a package includes a first package component having a first semiconductor die encapsulated in an encapsulant, a conductive via extending through the encapsulant, and a redistribution layer electrically connected to the first semiconductor die and the conductive via. The package further includes a second package component physically bonded to the first package component by a first plurality of connectors disposed on a bottom surface of the second package component. The package further includes a second plurality of connectors disposed on the bottom surface of the second package component, wherein the second plurality of connectors are electrically isolated from the first semiconductor die; and wherein the first plurality of connectors and the second plurality of connectors have different sizes.

In accordance with an embodiment, a method includes encapsulating a first integrated circuit die in an encapsulant, forming a redistribution layer (RDL) electrically connected to the first integrated circuit die, and bonding a substrate to the RDL using a plurality of functional connectors. The plurality of functional connectors electrically connects a second integrated circuit die to the first integrated circuit die, and the first integrated circuit die and the second integrated circuit die are disposed on opposing sides of the substrate. The method further includes disposing a plurality of dummy connectors between the substrate and the RDL. The plurality of functional connectors extends below the plurality of dummy connectors, and the plurality of functional connectors at least partially encircles the plurality of dummy connectors in a top down view. The method further includes dispensing an underfill between the substrate and the RDL.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   encapsulating a first integrated circuit die in an encapsulant;
   forming a redistribution layers (RDL) electrically connected to the first integrated circuit die;
   bonding a substrate to the RDL using a plurality of functional connectors, wherein the plurality of functional connectors electrically connects a second integrated circuit die to the first integrated circuit die, and wherein the first integrated circuit die and the second integrated circuit die are disposed on opposing sides of the substrate;
   disposing a plurality of dummy connectors between the substrate and the RDL, wherein the plurality of functional connectors extends below the plurality of dummy connectors, and wherein the plurality of functional connectors at least partially encircles the plurality of dummy connectors in a top down view, wherein the plurality of dummy connectors is in physical contact with a same surface of the substrate as the plurality of functional connectors; and
   dispensing an underfill between the same surface of the substrate and the RDL, the underfill is further dispensed around the plurality of functional connectors and the plurality of dummy connectors.

2. The method of claim 1 further comprising mounting a package substrate to an opposing side of the first integrated circuit die as the RDL.

3. The method of claim 1, wherein the underfill extends between the RDL and the plurality of dummy connectors along a line perpendicular to a major surface of the substrate.

4. The method of claim 1, the plurality of dummy connectors is disposed in a pattern in a top down view, wherein the pattern includes an array of dummy connectors, concentric circles of dummy connectors, an x-shape of dummy connectors, or a random distribution of dummy connectors.

5. The method of claim 1, wherein a pitch between adjacent ones of the plurality of dummy connectors is equal to or greater than a pitch between adjacent ones of the plurality of functional connectors.

6. The method of claim 1, wherein more functional connectors are disposed on a first side of the plurality of dummy connectors than a second side of the plurality of dummy connectors in a top down view, and wherein the first side of the plurality of dummy connectors is opposite the second side of the plurality of dummy connectors.

7. A method comprising:
   encapsulating a semiconductor die and a plurality of through vias in a molding compound;
   bonding a first package to the plurality of through vias, and wherein the first package comprises:
     a plurality of first connectors electrically connected to the semiconductor die by the plurality of through vias; and
     a plurality of second connectors disposed on physically contact a same surface of the first package as the plurality of first connectors, wherein the plurality of first connectors extend farther away from the same surface of the first package than the plurality of second connectors, and wherein the plurality of first connectors and the plurality of second connectors extend in a same direction away from the same surface of the first package; and
   dispensing an underfill around the plurality of first connectors and the plurality of second connectors.

8. The method of claim 7, wherein dispensing the underfill comprises using the plurality of second connectors to control a profile of a wavefront of the underfill while dispensing the underfill.

9. The method of claim 7 further comprising forming a redistribution layer electrically connected to the semiconductor die and the plurality of through vias, wherein the redistribution layer is disposed between the plurality of through vias and the first package.

10. The method of claim 9, after bonding the first package to the plurality of through vias, a gap is disposed between each of the plurality of second connectors and the redistribution layer.

11. The method of claim 7, wherein the plurality of second connectors is electrically isolated from the semiconductor die.

12. The method of claim 7, wherein the plurality of second connectors is electrically isolated from integrated circuits in the first package.

13. The method of claim 7, wherein bonding the first package to the plurality of through vias comprises reflowing the plurality of first connectors.

14. The method of claim 7, wherein the plurality of first connectors have a same material composition as the plurality of second connectors.

15. A method comprising:
   forming a first package, wherein forming the first package comprises:
      forming a through via adjacent a die;
      encapsulating the through via and the die in a molding compound; and
      forming a first redistribution layer electrically connecting the through via to the die;
   bonding a second package to the first package, wherein the second package comprises:
      a first plurality of connectors on a surface of the second package, wherein bonding the second package to the first package comprises reflowing the first plurality of connectors to contact the first package; and
      a second plurality of connectors on the surface of the second package and extending towards the first package, wherein the second plurality of connectors are separated from the first package by a gap after reflowing the first plurality of connectors to contact the first package.

16. The method of claim 15 further comprising dispensing an underfill between the first package and the second package.

17. The method of claim 16, wherein dispensing the underfill between the first package and the second package comprises dispensing an underfill in the gap.

18. The method of claim 15, wherein the first redistribution layer is disposed between the molding compound and the second package.

19. The method of claim 15 further comprising forming a second redistribution layer on an opposing side of the molding compound as the first redistribution layer.

20. The method of claim 15, wherein the second plurality of connectors is electrically isolated from the die.

* * * * *